US010032717B2

(12) United States Patent
Li et al.

(10) Patent No.: US 10,032,717 B2
(45) Date of Patent: Jul. 24, 2018

(54) VERTICAL FUSE STRUCTURES

(71) Applicant: International Business Machines Corporation, Armonk, NY (US)

(72) Inventors: Juntao Li, Cohoes, NY (US); Junli Wang, Slingerlands, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/796,974

(22) Filed: Oct. 30, 2017

(65) Prior Publication Data

US 2018/0061759 A1    Mar. 1, 2018

Related U.S. Application Data

(62) Division of application No. 15/246,797, filed on Aug. 25, 2016.

(51) Int. Cl.
| | |
|---|---|
| *H01L 27/11* | (2006.01) |
| *H01L 23/525* | (2006.01) |
| *H01L 21/8234* | (2006.01) |
| *H01L 27/06* | (2006.01) |
| *H01L 29/66* | (2006.01) |

(Continued)

(52) U.S. Cl.
CPC .. *H01L 23/5256* (2013.01); *H01L 21/823431* (2013.01); *H01L 21/823475* (2013.01); *H01L 27/0617* (2013.01); *H01L 27/0886* (2013.01); *H01L 29/66545* (2013.01); *H01L 29/785* (2013.01)

(58) Field of Classification Search
CPC ............................ H01L 23/5256; H01L 29/785
USPC .......................................... 257/379; 438/149
See application file for complete search history.

(56) References Cited

U.S. PATENT DOCUMENTS

| | | | |
|---|---|---|---|
| 4,227,168 A | 10/1980 | Knapp, Jr. | |
| 4,228,417 A | 10/1980 | Belcher | |

(Continued)

FOREIGN PATENT DOCUMENTS

| | | |
|---|---|---|
| CN | 101800083 A | 8/2010 |
| CN | 101800083 B | 3/2013 |
| CN | 204088327 U | 1/2015 |

OTHER PUBLICATIONS

English translation for China Application No. CN204088327U.
English translation for China Application No. CN101800083A.
List of IBM Patents or Patent Applications Treated as Related.

*Primary Examiner* — Jami M Valentine
(74) *Attorney, Agent, or Firm* — Vazken Alexanian; Ryan, Mason & Lewis, LLP

(57) ABSTRACT

Semiconductor devices and methods are provided in which vertical fuse devices are integrally formed with FINFET (Fin Field Effect Transistor) devices, wherein the vertical fuse devices are formed as part of a process flow for fabricating the FINFET devices. For example, a semiconductor device comprises first and second vertical semiconductor fins, a vertical fuse device, and a FINFET device. The vertical fuse device comprises a metal fuse element formed over a portion of the first vertical semiconductor fin, and the FINFET device comprises a metal gate electrode formed over a portion of the second vertical semiconductor fin. The metal fuse element and the metal gate electrode are concurrently formed as part of a replacement metal gate process flow.

20 Claims, 25 Drawing Sheets

(51) Int. Cl.
*H01L 27/088* (2006.01)
*H01L 29/78* (2006.01)

(56) References Cited

U.S. PATENT DOCUMENTS

| | | | |
|---|---|---|---|
| 4,240,058 A | 12/1980 | Kozacka et al. | |
| 4,245,208 A | 1/1981 | Belcher | |
| 4,254,394 A | 3/1981 | Kozacka et al. | |
| 4,272,752 A | 6/1981 | Jacobs, Jr. | |
| 4,306,212 A | 12/1981 | Belcher | |
| 6,754,135 B2 | 6/2004 | Pilo | |
| 6,897,543 B1 | 5/2005 | Huang et al. | |
| 6,998,865 B2 | 2/2006 | Bard et al. | |
| 7,157,782 B1 | 1/2007 | Shih et al. | |
| 7,272,067 B1 | 9/2007 | Huang et al. | |
| 7,531,886 B2 | 5/2009 | Chakravarti et al. | |
| 8,030,736 B2 | 10/2011 | Booth, Jr. et al. | |
| 8,053,809 B2 | 11/2011 | Cheng et al. | |
| 8,294,159 B2 * | 10/2012 | Or-Bach | H01L 21/76254 257/74 |
| 8,400,813 B2 | 3/2013 | Lee | |
| 8,471,296 B2 | 6/2013 | Cheng et al. | |
| 8,492,286 B2 | 7/2013 | Utomo et al. | |
| 8,630,108 B2 | 1/2014 | Li | |
| 8,957,482 B2 | 2/2015 | Hsueh et al. | |
| 8,969,999 B2 | 3/2015 | Liang et al. | |
| 9,728,542 B1 * | 8/2017 | Balakrishnan | H01L 27/11206 |
| 2011/0156857 A1 | 6/2011 | Kurz et al. | |
| 2012/0129301 A1 * | 5/2012 | Or-Bach | H01L 21/6835 438/129 |
| 2012/0187528 A1 | 7/2012 | Cheng et al. | |
| 2013/0105895 A1 * | 5/2013 | Liang | H01L 27/11206 257/347 |
| 2015/0325647 A1 | 11/2015 | Kanike | |
| 2016/0351498 A1 * | 12/2016 | Chang | G11C 17/143 |

* cited by examiner

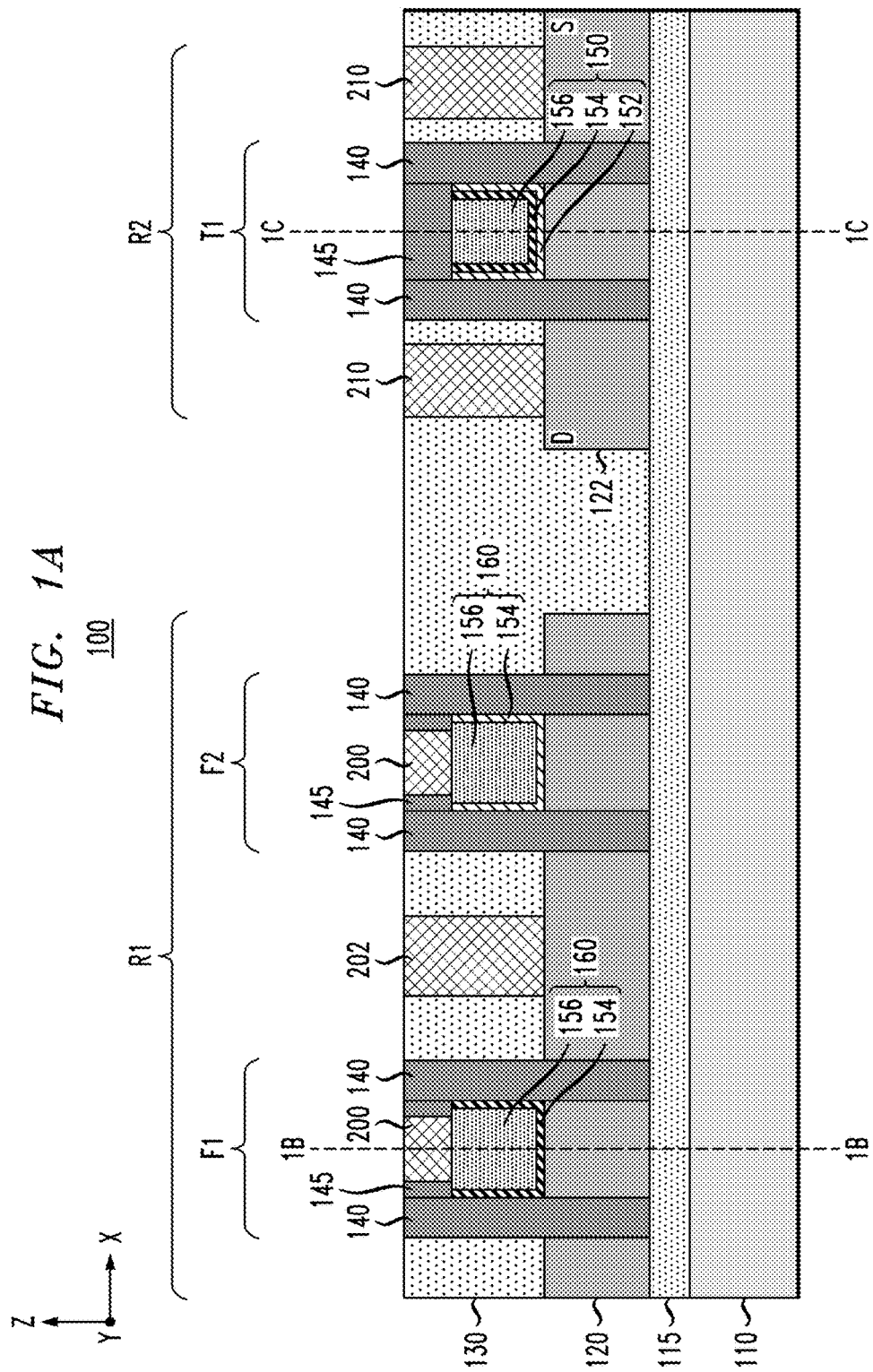

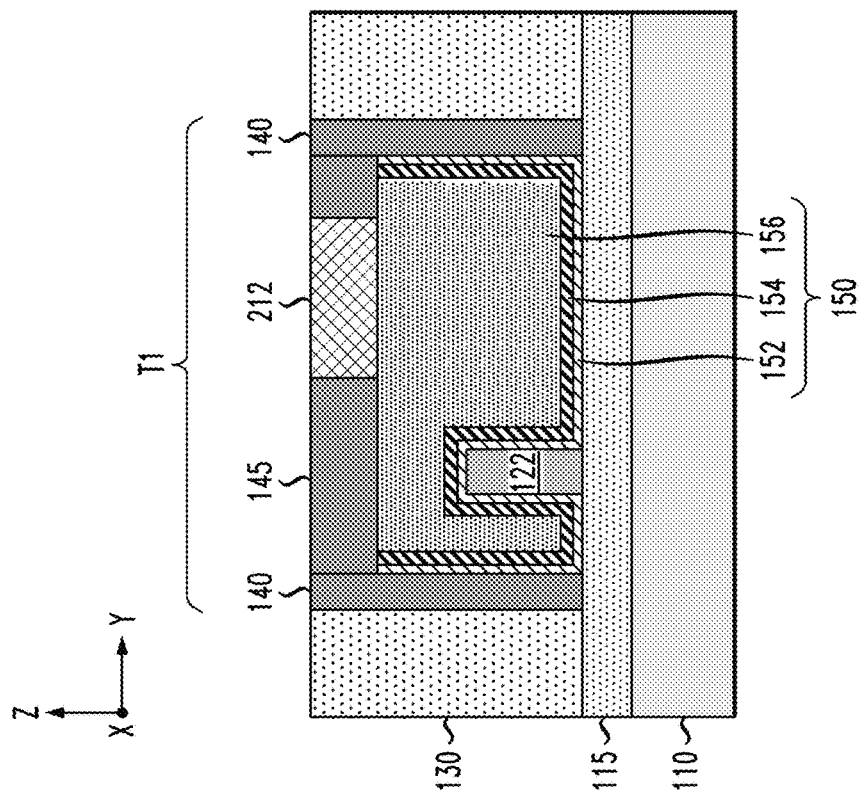
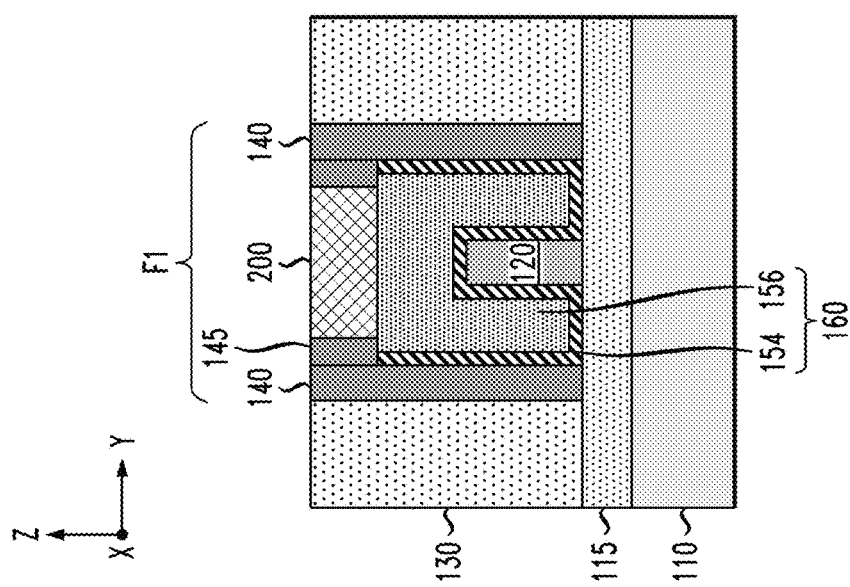

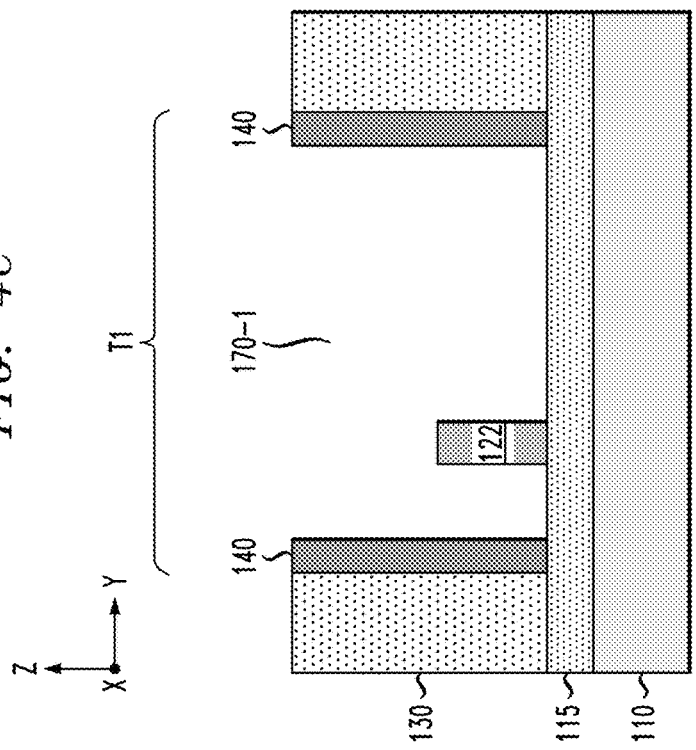
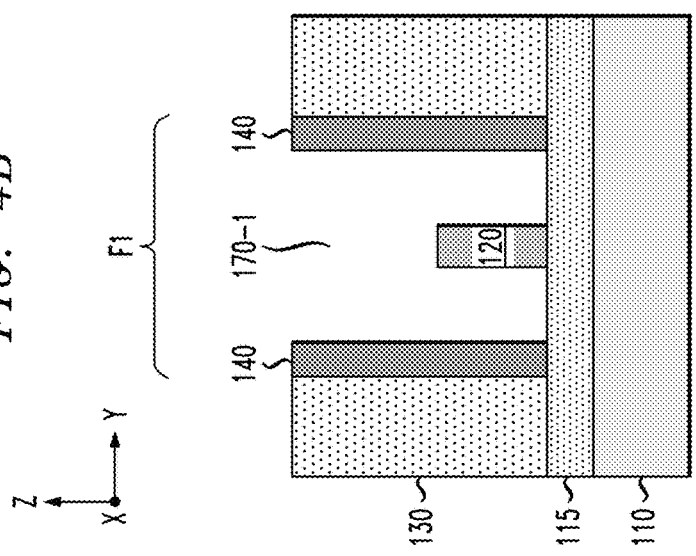

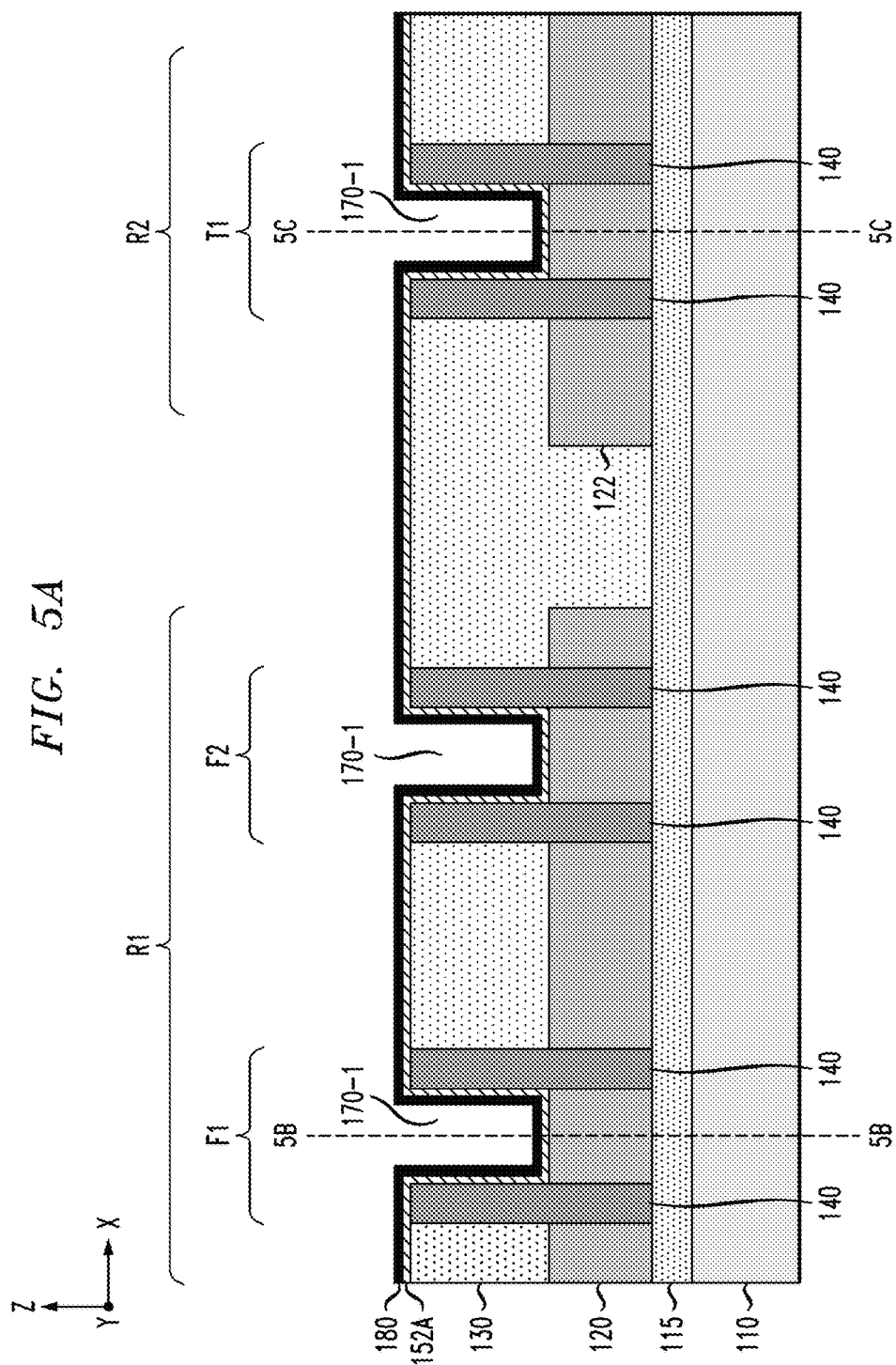

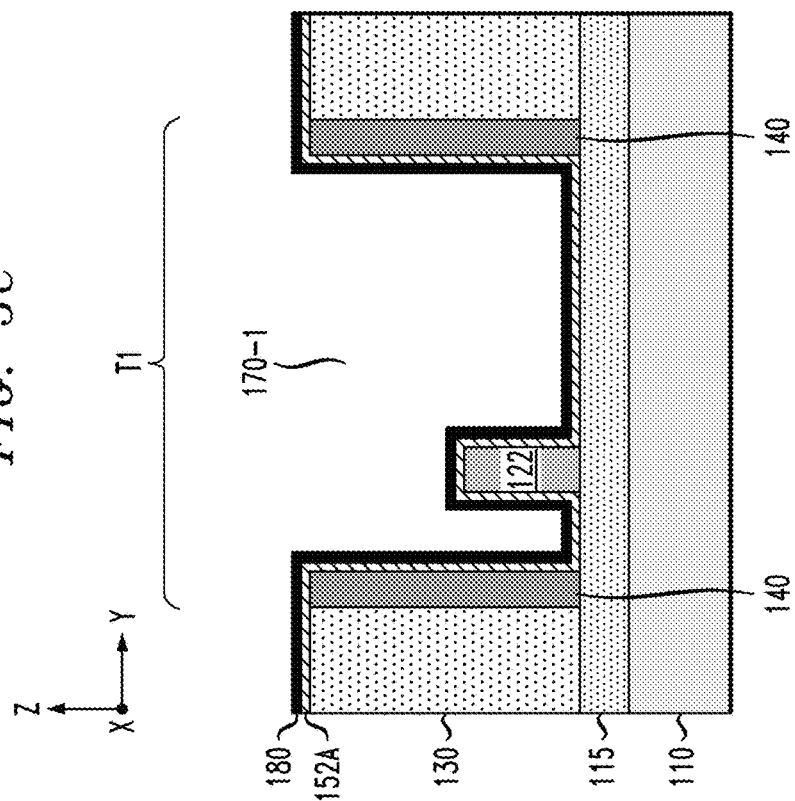
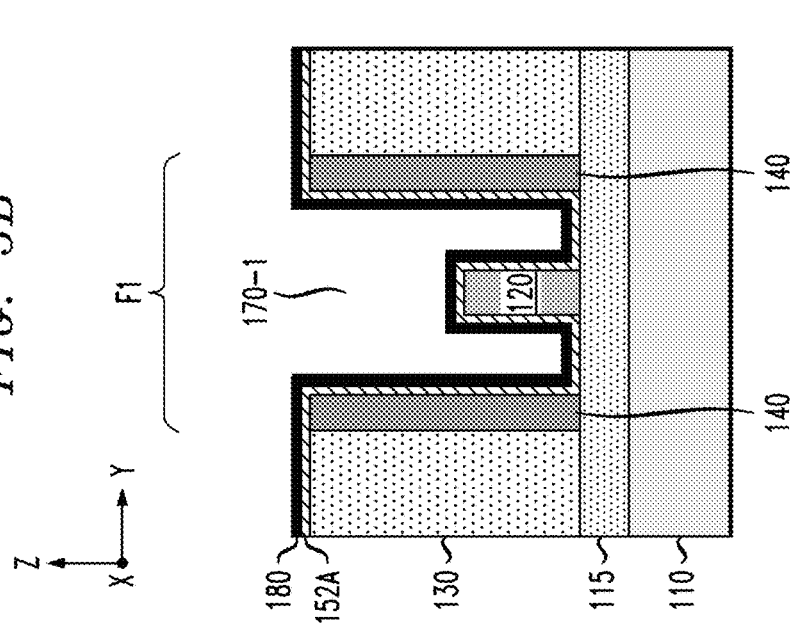

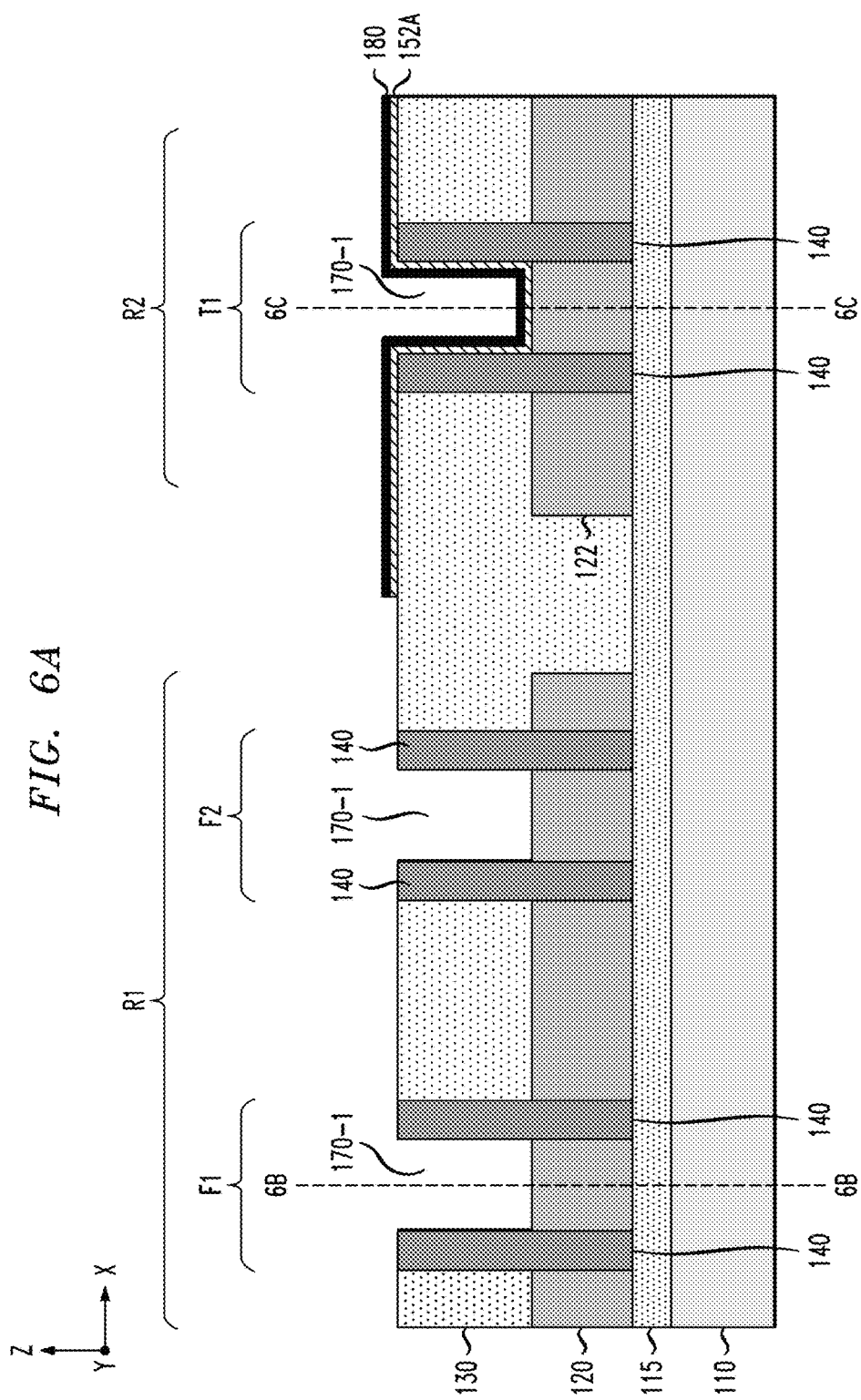

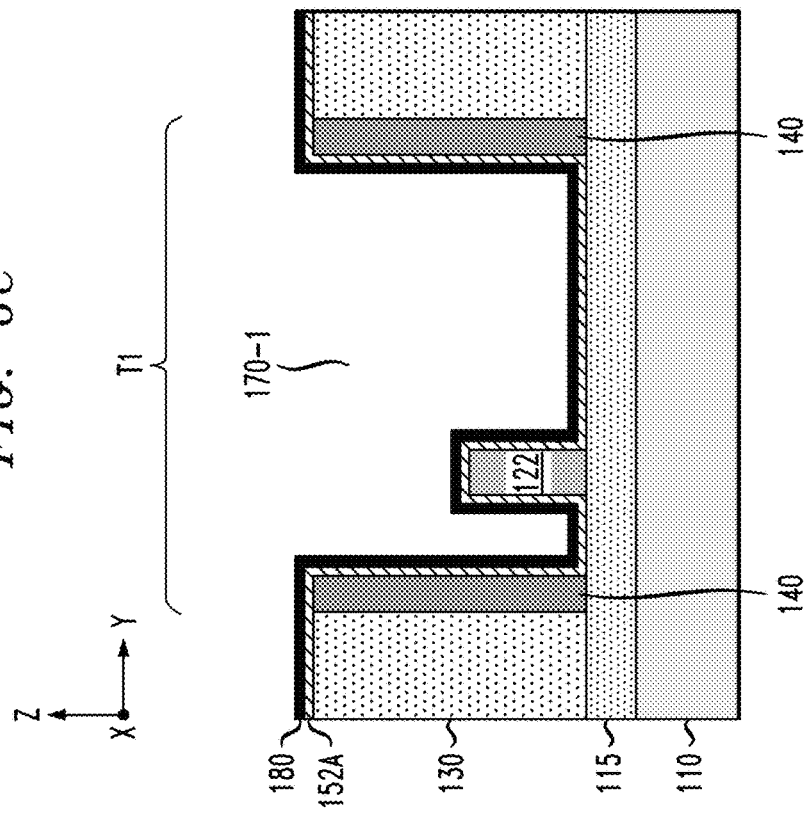
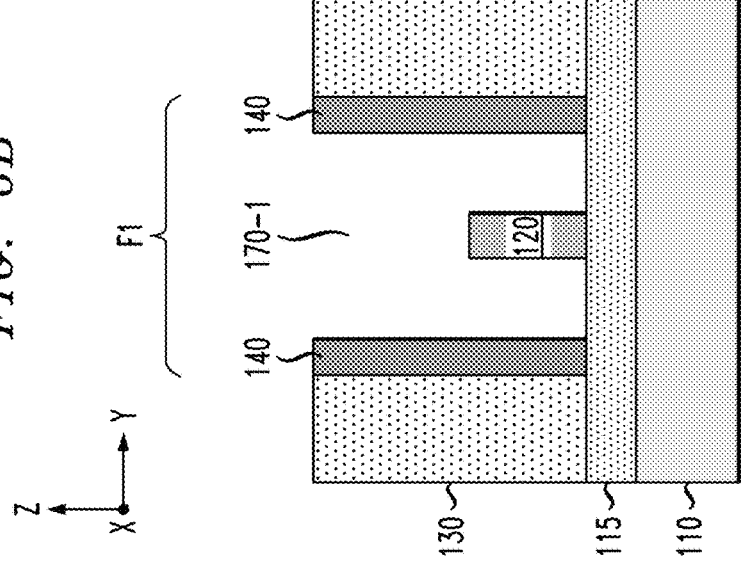

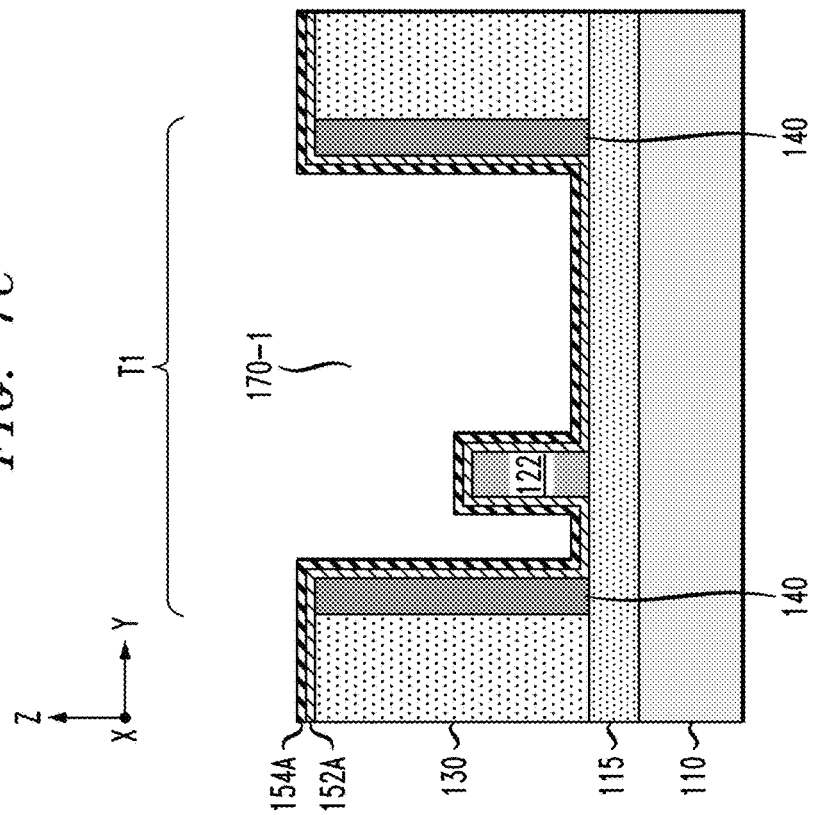
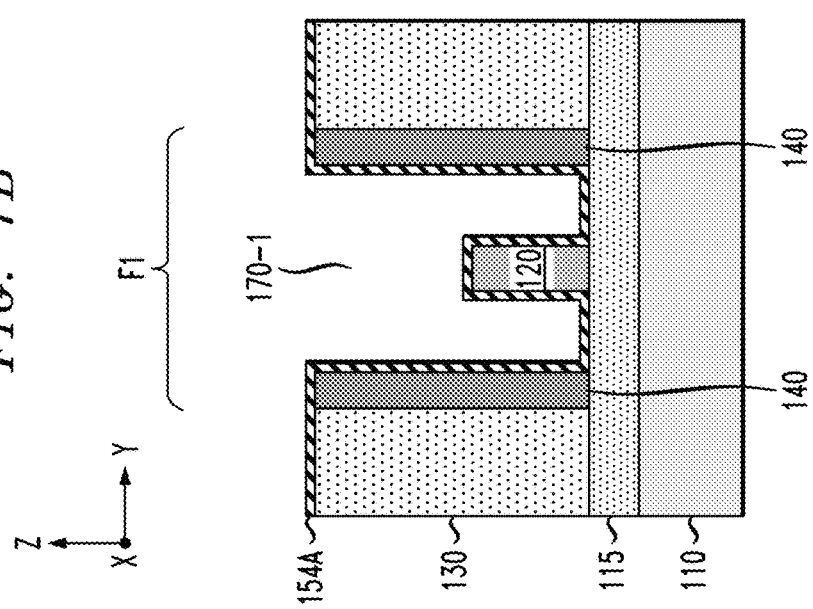

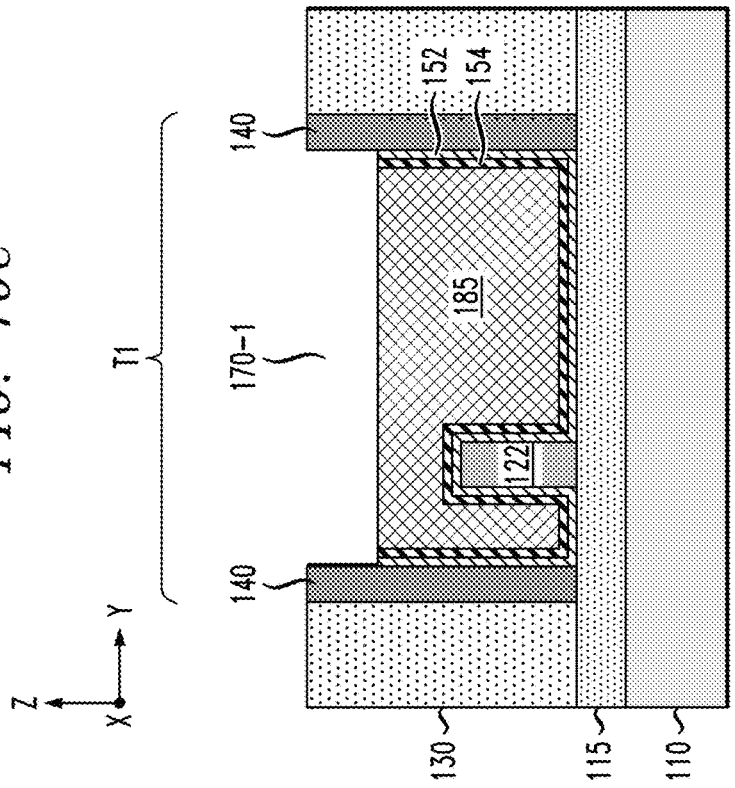
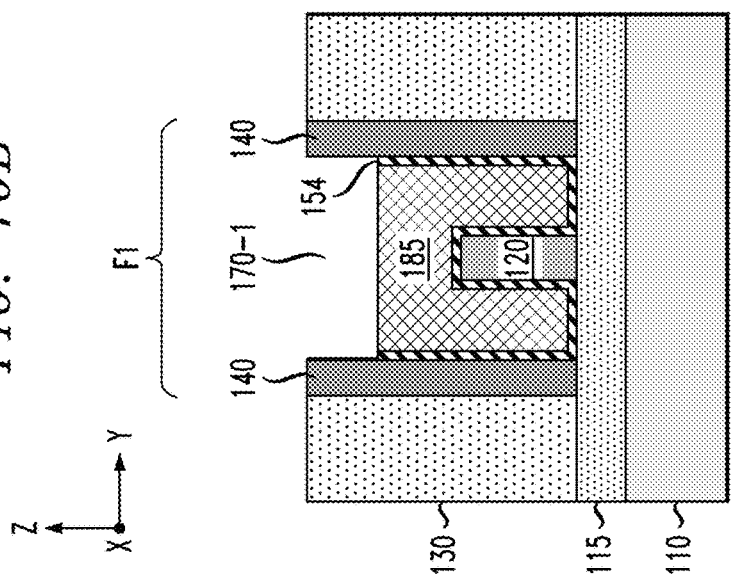

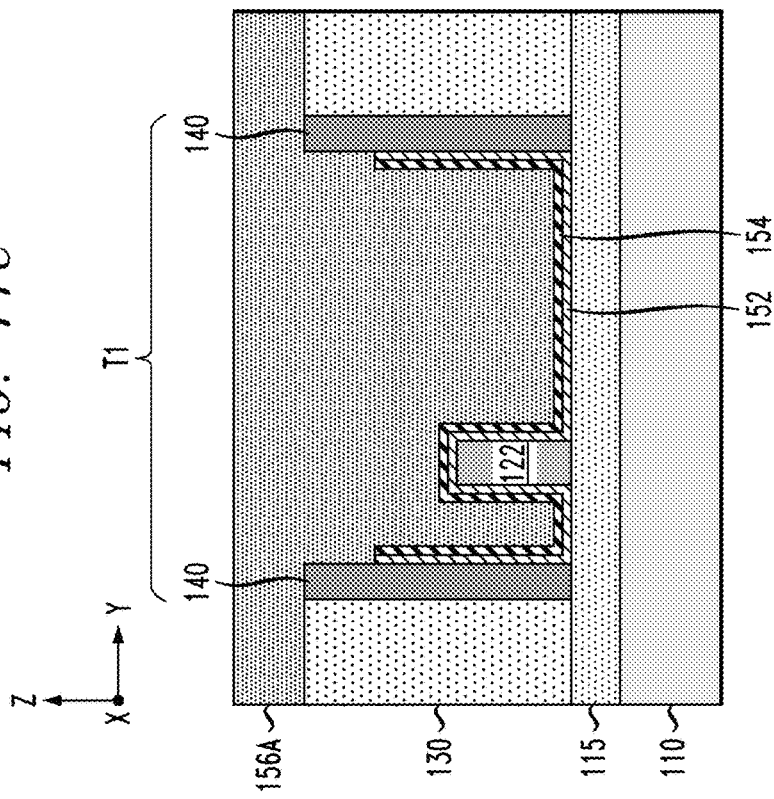
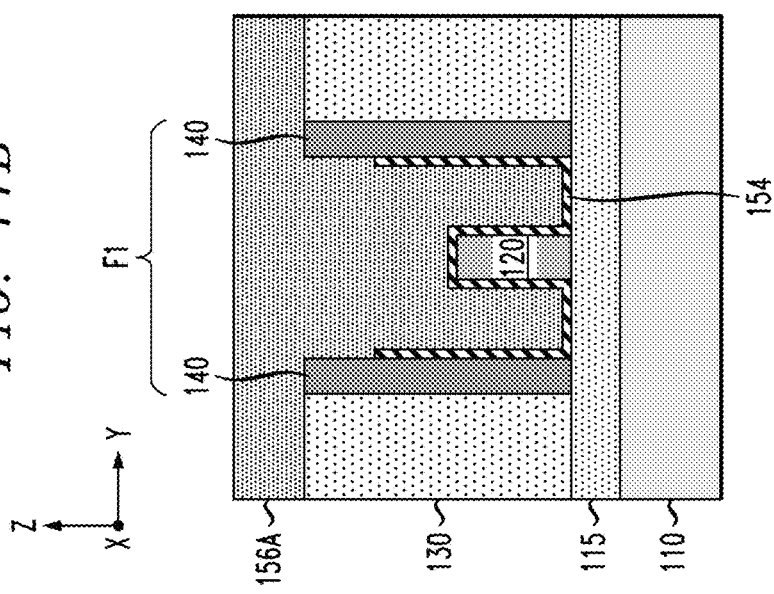

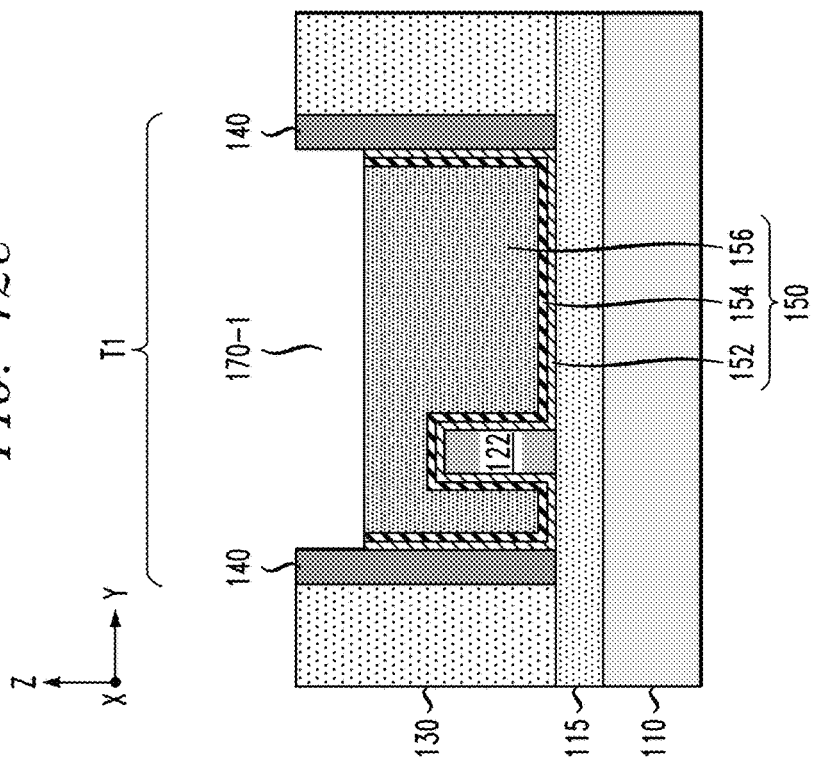
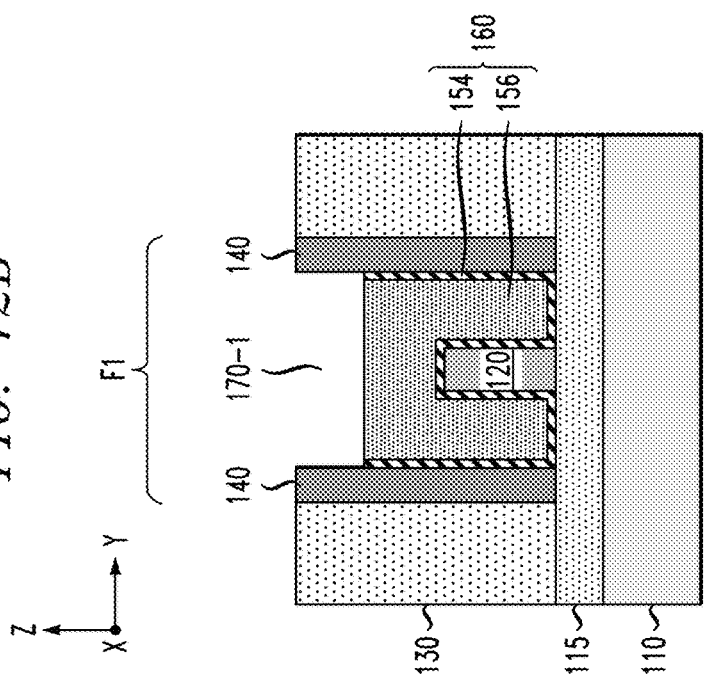

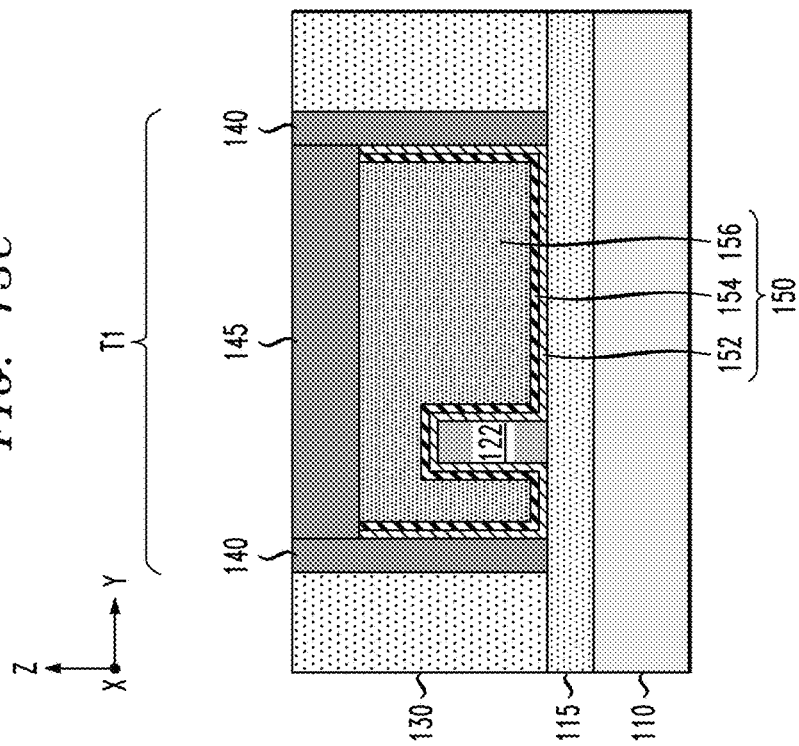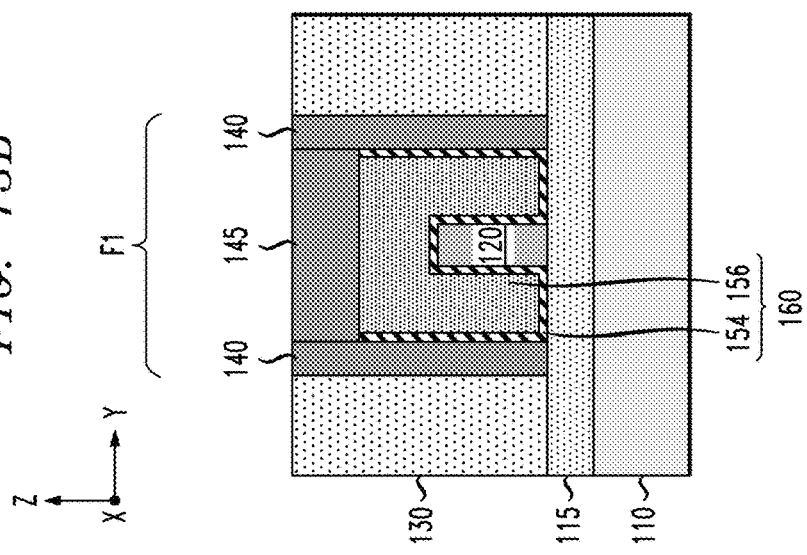

VERTICAL FUSE STRUCTURES

TECHNICAL FIELD

This disclosure relates generally to semiconductor fabrication techniques and, in particular, to structures and methods for fabricating electrical fuse structures.

BACKGROUND

A fuse is an electrical device which has a low resistance conductive path that is designed to be broken when an electrical current through the low resistance conductive path exceeds a specified limit. Electrical fuses are utilized in semiconductor integrated circuits for various applications including, for example, enabling redundant circuitry, programming one-time programmable read-only memory (PROM), configuring programmable logic devices (PLDs), trimming elements in analog trimming circuitry, implementing chip identification circuitry, etc. The dimensions of integrated fuse devices in semiconductor circuitry is limited by the allowable photolithographic minimal dimensions. Moreover, the fabrication of integrated fuse devices using conventional CMOS technologies can require multiple deposition and lithographic masking steps, which is time consuming and expensive. In this regard, the amount and complexity of additional processing steps that are incorporated as part of a semiconductor process flow to fabricate integrated fuse devices should be minimized to reduce the fabrication costs and processing time for constructing semiconductor chips with integrated fuse devices. Furthermore, the footprint area occupied by integrated fuse devices should be minimized, as well as the power consumption of integrated fuse devices.

SUMMARY

Embodiments of the invention include semiconductor devices having vertical fuse devices that are integrated with FINFET (Fin Field Effect Transistor) devices, as well as methods for integrally forming vertical fuse devices as part of a process flow for fabricating FINFET devices.

For example, one embodiment of the invention includes a method for forming a semiconductor device. The method comprises forming a plurality of vertical semiconductor fins on a semiconductor substrate, wherein the plurality of vertical semiconductor fins include a first vertical semiconductor fin and a second vertical semiconductor fin; forming a vertical fuse device having a first dummy gate structure formed over a portion of the first vertical semiconductor fin; forming a FINFET device having a second dummy gate structure formed over a portion of the second vertical semiconductor fin; and performing a RMG (replacement metal gate) process to remove the first and second dummy gate structures, and to replace the first dummy gate structure with a metal fuse element for the vertical fuse device and replace the second dummy gate structure with a metal gate electrode for the FINFET device.

Another embodiment of the invention includes a semiconductor device. The semiconductor device comprises a plurality of vertical semiconductor fins formed on a semiconductor substrate, wherein the plurality of vertical semiconductor fins comprises a first vertical semiconductor fin and a second vertical semiconductor fin. The semiconductor device further comprises a vertical fuse device and a FINFET device. The vertical fuse device comprises a metal fuse element formed over a portion of the first vertical semiconductor fin, wherein the metal fuse element comprises a first conformal metal layer formed on the portion of the first vertical semiconductor fin, and a first metal electrode layer formed on the first conformal metal layer. The FINFET device comprises a metal gate electrode formed over a portion of the second vertical semiconductor fin, wherein the metal gate electrode comprises a high-k metal gate stack structure conformally formed on the portion of the second vertical semiconductor fin, and a second metal electrode layer formed on the high-k metal gate stack structure. The high-k metal gate stack structure comprises a conformal layer of dielectric material formed on the portion of the second vertical semiconductor fin and a second conformal metal layer formed on the conformal layer of dielectric material. The first conformal metal layer and the second conformal metal layer are patterned from a same conformal layer of metallic material, and the first metal electrode layer and the second metal electrode layer are patterned from a same layer of metallic material.

Other embodiments will be described in the following detailed description of embodiments, which is to be read in conjunction with the accompanying figures.

BRIEF DESCRIPTION OF THE DRAWINGS

FIGS. 1A, 1B, and 1C are schematic views of a semiconductor device having vertical fuse devices that are integrated with FINFET devices, according to an embodiment of the invention.

FIGS. 3A/3B/3C through FIGS. 13A/13B/13C schematically illustrate a method for fabricating the semiconductor device of FIGS. 1A/1B/1C, according to an embodiment of the invention, wherein:

FIGS. 3A/3B/3C are cross-sectional views of the semiconductor device at an intermediate stage of fabrication in which vertical fuse devices with dummy gate structures are formed in a first device region, and FINFET devices with dummy gate structures are formed in second device region;

FIGS. 5A/5B/5C are cross-sectional views of the semiconductor structure of FIGS. 4A/4B/4C after depositing a conformal layer of gate dielectric material and depositing a conformal protective capping layer over the conformal layer of gate dielectric material;

FIGS. 6A/6B/6C are cross-sectional views of the semiconductor structure of FIGS. 5A/5B/5C after removing the conformal layer of gate dielectric material and the protective capping layer in the first device;

DETAILED DESCRIPTION

Figure 2:
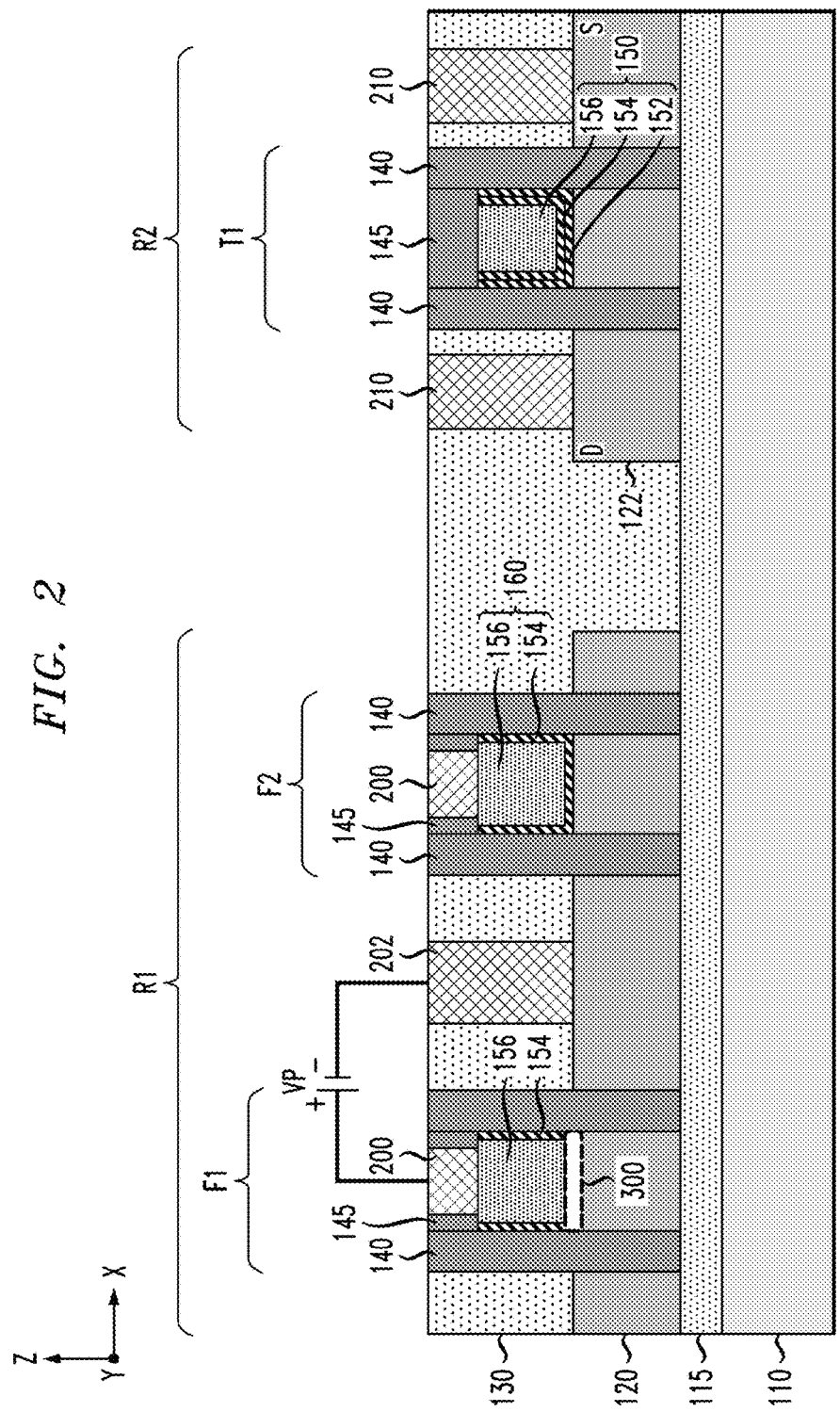
FIG. 2 schematically illustrates a method for programming a vertical fuse device of the semiconductor device shown in FIG. 1A, according to an embodiment of the invention.

Embodiments of the invention will now be described in further detail with regard to semiconductor devices having vertical fuse devices that are integrated with FINFET devices, as well as methods for integrally forming vertical fuse devices as part of a FEOL (front-end-of-line) process flow for fabricating FINFET devices. As explained in further detail below, semiconductor fabrication techniques according to embodiments of the invention enable vertical fuse structures to be readily fabricated using CMOS (complementary metal oxide semiconductor) process modules in a FEOL process flow to construct FINFET devices without the need for additional processes steps or processing time to construct the vertical fuse devices. The exemplary semiconductor process flows described herein allow integration of vertical fuse devices with FINFET devices for technology nodes of 7 nm and beyond.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

FIGS. 1A, 1B and 1B are schematic views of a semiconductor device 100 having vertical fuse devices that are integrated with FINFET devices, according to an embodiment of the invention. FIG. 1A is a schematic side view of the semiconductor device 100, FIG. 1B is a schematic cross-sectional view of the semiconductor device 100 taken along line 1B-1B in FIG. 1A, and FIG. 1C is a schematic cross-sectional view of the semiconductor device 100 taken along line 1C-1C in FIG. 1A. More specifically, FIG. 1A is a schematic side view of the semiconductor device 100 in a X-Z plane, and FIGS. 1B and 1C are cross-sectional views of the semiconductor device 100 in a Y-Z plane, as indicated by the respective XYZ Cartesian coordinates shown in FIGS. 1A, 1B, and 1C. It is to be understood that the term "vertical" or "vertical direction" as used herein denotes a Z-direction of the Cartesian coordinates shown in the drawings, and the term "horizontal" or "horizontal direction" as used herein denotes an X-direction and/or Y-direction of the Cartesian coordinates shown in the drawings.

As collectively shown in FIGS. 1A/1B/1C, the semiconductor device 100 comprises a substrate 110/115 which includes a bulk substrate layer 110 and an insulating layer 115 (e.g., a buried oxide layer of an SOI substrate), a plurality of vertical fuse devices F1 and F2 formed in a first region R1 (or vertical fuse device region) of the semiconductor device 100, and a FINFET device T1 formed in a second device region R2 (or FINFET device region) of the semiconductor device 100. Each vertical fuse device F1 and F2 comprises a vertical semiconductor fin 120 (which extends along the substrate 110/115 in an X-direction as shown), insulating sidewall spacers 140, an insulating capping layer 145, and a metallic fuse element 160. The insulating sidewall spacers 140 and capping layer 145 serve to encapsulate and insulate the metallic fuse element 160 from surrounding structures. The FINFET device T1 comprises a vertical semiconductor fin 122 (which extends along the substrate 110/115 in an X direction as shown), insulating sidewall spacers 140, an insulting capping layer 145, and a metal gate electrode 150. The vertical semiconductor fin 122 provides a vertical channel for the FINFET device T1 along a portion of the vertical semiconductor fin 122 which is encapsulated/surrounded by the metal gate electrode 150.

In one embodiment of the invention, the metal gate electrode 150 of the FINFET device T1 and the metallic fuse elements 160 of the vertical fuse devices F1 and F2 are concurrently formed as part of a RMG (replacement metal gate) process flow, which will be discussed in further detail below. As shown in FIGS. 1A and 1C, the metal gate electrode 150 of the FINFET device T1 comprises a thin conformal gate dielectric layer 152 (which conformally covers a segment of the vertical semiconductor fin 122 that serves as the vertical channel for the FINFET device T1), a thin conformal work function metal (WFM) layer 154 that is formed over the conformal gate dielectric layer 152, and a metal electrode layer 156. In one embodiment of the invention, the conformal gate dielectric layer 152 and the conformal WFM layer 154 comprise a high-k metal gate stack structure 152/154.

Moreover, as shown in FIGS. 1A and 1B, the metallic fuse elements 160 of the vertical fuse devices F1 and F2 each comprise layers of the same metallic materials 154 and 156 used to form the conformal WFM layer 154 and the metal electrode layer 156 of the FINFET device T1. The metallic fuse elements 160 are formed as part of a RMG process flow that is used to form metal gate electrodes (e.g., metal gate electrode 150) of the FINFET devices (e.g., FINFET device T1) in the second device region R2 of the semiconductor device 100. However, while the conformal gate dielectric layer 152 is deposited over both device regions R1 and R2 as part of the RMG process flow, the portion of the conformal gate dielectric layer 152 in the vertical fuse device region R1 is removed prior to depositing the layers of metallic material used to form the conformal WFM layer 154 and the metal electrode layer 156 in the device regions R1 and R2.

As further depicted in FIGS. 1A, 1B, and 1C, the vertical fuse devices F1/F2 and the FINFET device T1 are encapsulated in a layer of insulating material 130. In one embodiment of the invention, the layer of insulating material 130 comprises a PMD (pre-metal dielectric) layer of a MOL (middle of the line) layer of the semiconductor device 100. The semiconductor device 100 further comprise a plurality of vertical contacts (e.g., contacts 200, 202, 210 and 212) formed in the capping layers 145 of the vertical devices F1, F2, and T1, and in the layer of insulating material 130. The contacts 200, 202, 210 and 212 may be considered MOL device contacts that are formed as part of the MOL layer of the semiconductor device 100 to provide vertical contacts to the vertical devices F1, F2 and T1. Each MOL device contact may comprises a liner/barrier layer and a conductive via, as is known in the art.

The fuse contact terminals 200 are formed in openings that are patterned in the capping layers 145 of the vertical fuse devices F1 and F2 to provide contacts to the metallic fuse elements 160 of the vertical fuse devices F1 and F2. The fuse contact terminal 202 is formed in an opening that is patterned in the layer of insulating material 130 to make contact with a portion of the vertical semiconductor fin 120 between the adjacent vertical fuse devices F1 and F2. In this structural configuration, the vertical semiconductor fin 120 in the vertical fuse device region R1 serves as one segment of a conducting path between the first fuse contact terminal 200 (e.g., anode) and the second fuse contact terminal 202 (e.g., cathode) of the vertical fuse devices F1 and F2, while each metallic fuse element 160 serves as another segment of the conducting path between the first and second fuse contact terminals 200 and 202 of the vertical fuse devices F1 and F2. In the example embodiment shown in FIG. 1A, the adjacent vertical fuse devices F1 and F2 commonly share the second fuse contact terminal 202.

The gate contact 212 (FIG. 1C) is formed in an opening that is patterned in the capping layer 145 of the FINFET device T1 to provide a contact to the metal gate electrode 150 of the FINFET device T1. The source/drain contacts 210 are formed openings that are patterned in the layer of insulating material 130 to make contact with portions of the vertical semiconductor fin 120 which serve as source/drain regions of the FINFET device T1.

It is to be understood that the vertical semiconductor fins 120 and 122 are generically depicted through the drawings, but can be formed of different materials using various fabrication methods. For example, the vertical semiconductor fins 120 and 122 can be formed by etching/patterning an active silicon layer that is formed on top of the insulating layer 115 (e.g., an SOI layer of an SOI substrate). In another embodiment, the vertical semiconductor fins 120 and 122 can be formed by patterning an upper surface of a bulk semiconductor substrate. In yet another embodiment, the vertical semiconductor fins 120 and 122 may be formed by depositing a layer of insulating material on top of a semiconductor substrate, patterning the layer of insulating material to form a pattern of trenches in the insulating material which corresponds to the pattern of vertical semiconductor fins to be fabricated, and then performing a bottom-up epitaxial growth process to grow epitaxial semiconductor material within the trenches to form the vertical semiconductor fins 120 and 122. In one example embodiment of the invention, the vertical semiconductor fins 120 and 122 are formed with a vertical height in a range of about 25 nm to about 30 nm.

Depending on the target application, the vertical semiconductor fins 120 and 122 may be formed of silicon material, SiGe material, epitaxially grown semiconductor material, compound semiconductor materials (e.g., III-V material), etc. Further, to increase the conductivity of the semiconductor material of the vertical semiconductor fin 120 for the vertical fuse devices F1 and F2, the vertical semiconductor fin 120 in the device region R1 can be doped with, e.g., n-type dopants or p-type dopants, using known ion implantations methods followed by annealing.

Further, the vertical semiconductor fin 122 in the FINFET device region R2 may comprise epitaxial source/drain regions (e.g., drain region (D) and source region (S) as depicted in FIG. 1A) that are epitaxially grown on the portions of the vertical semiconductor fin 122 that extend from the insulating sidewall spacers 140 of the metal gate electrode 150, which are contacted by the source/drain contacts 210. Moreover, silicide layers can be formed on areas of the vertical semiconductor fins 120 and 122 to provide ohmic contacts between the vertical semiconductor fins 120 and 122 and the vertical contacts 202 and 210. It is to be understood that the term "source/drain region" as used herein means that a given source/drain region can be either a source region or a drain region, depending on the application.

In one embodiment of the invention, the programming (or "burning") of a vertical fuse device (e.g., vertical fuse device F1 or F2) is achieved by breaking the conductive path between the first fuse contact terminal 200 and the second fuse contact terminal 202 of a given vertical fuse device by the application of a high DC voltage applied to the vertical fuse device across the first and second fuse contact terminals 200 and 202. For example, FIG. 2 schematically illustrates a method for programming a vertical fuse device of the semiconductor device shown in FIG. 1A, according to an embodiment of the invention. In particular, FIG. 2 illustrates a method of programming the vertical fuse device F1 by applying a DC programming voltage VP to the first and second fuse contact terminals 200 and 202 to generate a high current density in the metallic fuse element 160. The high current density in the metallic fuse element 160 causes a significant increase in the heat density of the metallic material of the thin WFM layer 154 at the interface between the vertical semiconductor fin 120 and the metal electrode layer 156. The increased current density, and thus heat density, causes the metallic material of the thin WFM layer 154 to melt and/or vaporize, and generate a void 300 (or high resistance region). This effectively results in breaking the low-resistance conductive path (through the metallic fuse element 160 and the vertical semiconductor fin 120) between the first and second fuse contact terminals 200 and 202. On the other hand, when a normal operating voltage is applied to the first and second fuse contact terminals 200 and 202, current will flow through the metallic fuse element 160 and the vertical semiconductor fin 120 between the first and second fuse contact terminals 200 and 202, without causing the vertical fuse device F1 to blow (e.g., without melting/vaporing the thin WFM layer 154).

Figure 3A:
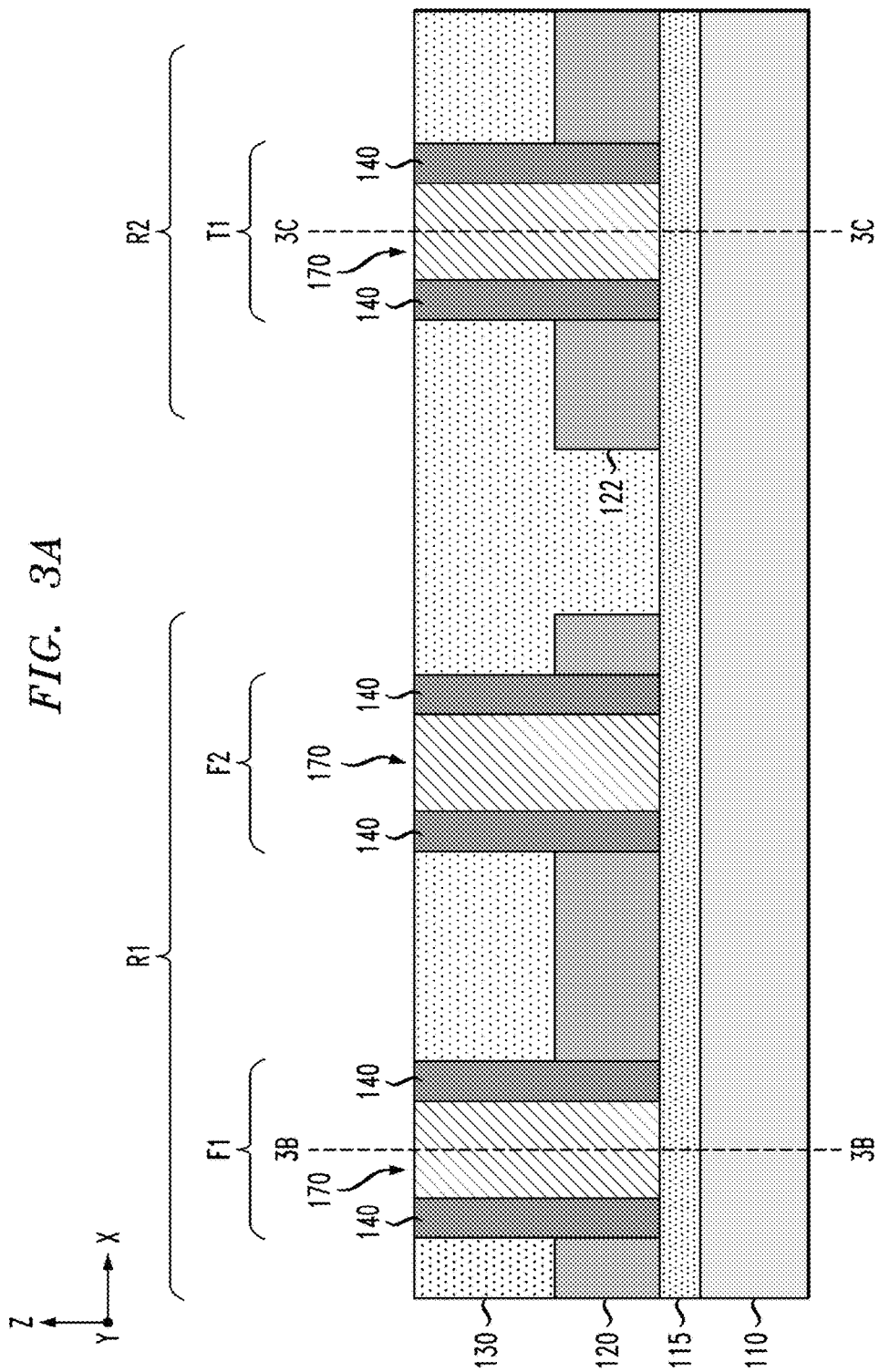
Figure 3C:
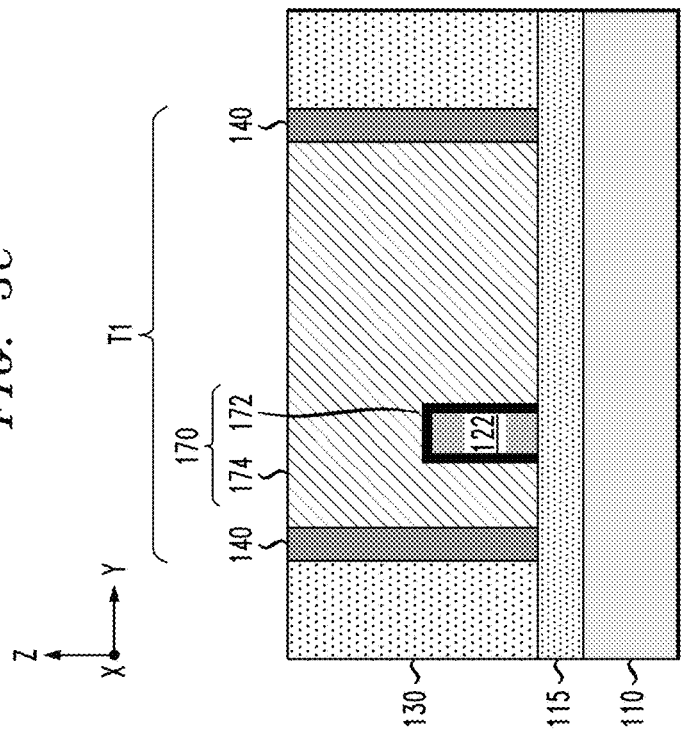
Figure 3B:
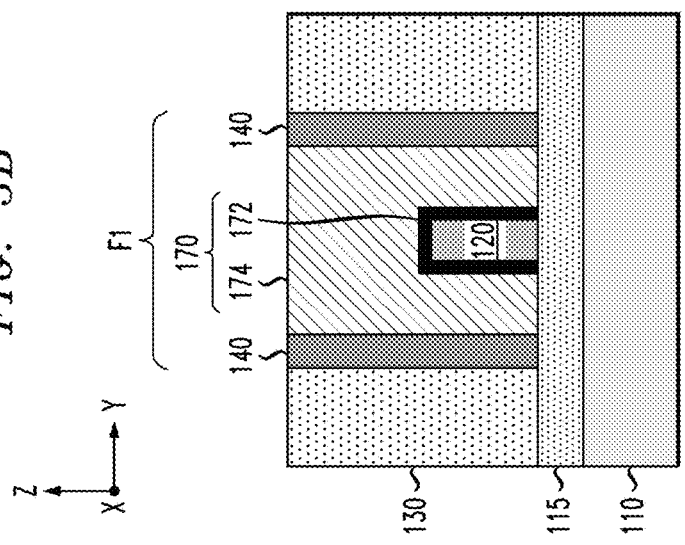

Methods for fabricating the semiconductor device 100 shown in FIGS. 1A/1B/1C will now be discussed in further detail with reference to FIGS. 3A/3B/3C through FIGS. 13A/13B/13C, which schematically illustrate the semiconductor device 100 of FIGS. 1A/1B/C at various stages of fabrication. To begin, FIGS. 3A/3B/3C are cross-sectional views of the semiconductor device 100 at an intermediate stage of fabrication in which the vertical fuse devices F1 and F2 and FINFET device T1 are formed with dummy gate structures 170. FIG. 3B is a schematic cross-sectional view of the semiconductor structure of FIG. 3A taken along line 3B-3B in FIG. 3A, and FIG. 3C is a schematic cross-sectional view of the semiconductor structure of FIG. 3A taken along line 3C-3C in FIG. 3A. The semiconductor structure shown in FIGS. 3A/3B/3C can be fabricated using known materials and known semiconductor fabrication techniques.

For example, as noted above, in one embodiment, the substrate 110/115 comprises a SOI substrate, wherein the base substrate 210 is formed of silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. The insulating layer 115 (e.g., oxide layer) is disposed between the base semiconductor substrate 110 and an active semiconductor layer (e.g., active silicon layer), wherein the active semiconductor layer is patterned using known methods to fabricate the semiconductor fin structures 120 and 122.

Moreover, epitaxial source/drain regions can be epitaxially grown on exposed portions of the semiconductor fin structure 122 using known methods, such as such as CVD (chemical vapor deposition), MOCVD (metal-organic CVD), LPCVD (Low Pressure CVD), MBE (molecular beam epitaxy), VPE (vapor-phase epitaxy), or other known epitaxial growth techniques which are suitable for the given process flow. The type of epitaxial semiconductor material that is used to form source/drain regions on the exposed portions of the vertical semiconductor fin 122 will vary depending on various factors including, but are not limited to, the type of material of the vertical semiconductor fin 122, the device type (e.g., n-type or p-type) of the FINFET device T1, etc. Moreover, the source/drain regions S/D can be doped using standard doping techniques. For example, the doping of the source/drain regions can be performed in-situ during the epitaxial growth of the source/drain regions, or ex-situ by ion implantation. For example, the source/drain regions can be doped with Group III elements (for p-type FINFET devices) or Group V elements (for n-type FINFET devices). Typical dopants include Boron, Arsenic, Phosphorus, Gallium, Antimony, etc. For example, boron is a p-type dopant, whereas Phosphorus is an n-type dopant.

As shown in FIGS. 3B and 3C, each dummy gate structure 170 comprises a dummy gate oxide layer 172 which conformally covers the vertical semiconductor fins 120 and 122, and a dummy poly gate layer 174 which, in one embodiment, comprises polysilicon. The dummy gate structures 170 are formed using known techniques. For example, a thin conformal layer of silicon oxide is formed over the vertical semiconductor fins 120 and 122, followed by the deposition of a layer of polysilicon over the vertical semiconductor fins 120 and 122. The silicon oxide and polysilicon layers are then patterned using known techniques to form the dummy gate structures 170 over target regions of the vertical semiconductor fins 120 and 122 where the vertical fuse and FINFET devices are to be formed in the device regions R1 and R2.

After forming the dummy gate structures 170, the insulating sidewall spacers 40 are formed by depositing a layer of dielectric material, such as silicon nitride (SiN), to encapsulate the dummy gate structures 170, followed by patterning the layer of dielectric material using known techniques. The layer of insulating material 130 (e.g., PMD layer 130) is formed by depositing a layer of dielectric material over the surface of the semiconductor device, and then planarizing the dielectric material down to the upper surface of the dummy gate structures 170. The PMD layer 130 may be formed with any suitable insulating/dielectric materials such as, for example, silicon oxide, silicon nitride, hydrogenated silicon carbon oxide, silicon based low-k dielectrics, porous dielectrics, or organic dielectrics including porous organic dielectrics, ULK (ultra-low-k) dielectrics, etc. The PMD layer 130 may be formed using known deposition techniques, such as, for example, ALD (atomic layer deposition), CVD (chemical vapor deposition), PECVD (plasma enhanced CVD), spin on deposition, or PVD (physical vapor deposition), followed by a planarization process which is performed using, e.g., chemical mechanical polishing (CMP), resulting in the semiconductor structure shown in FIGS. 3A/3B/3C.

Figure 4A:
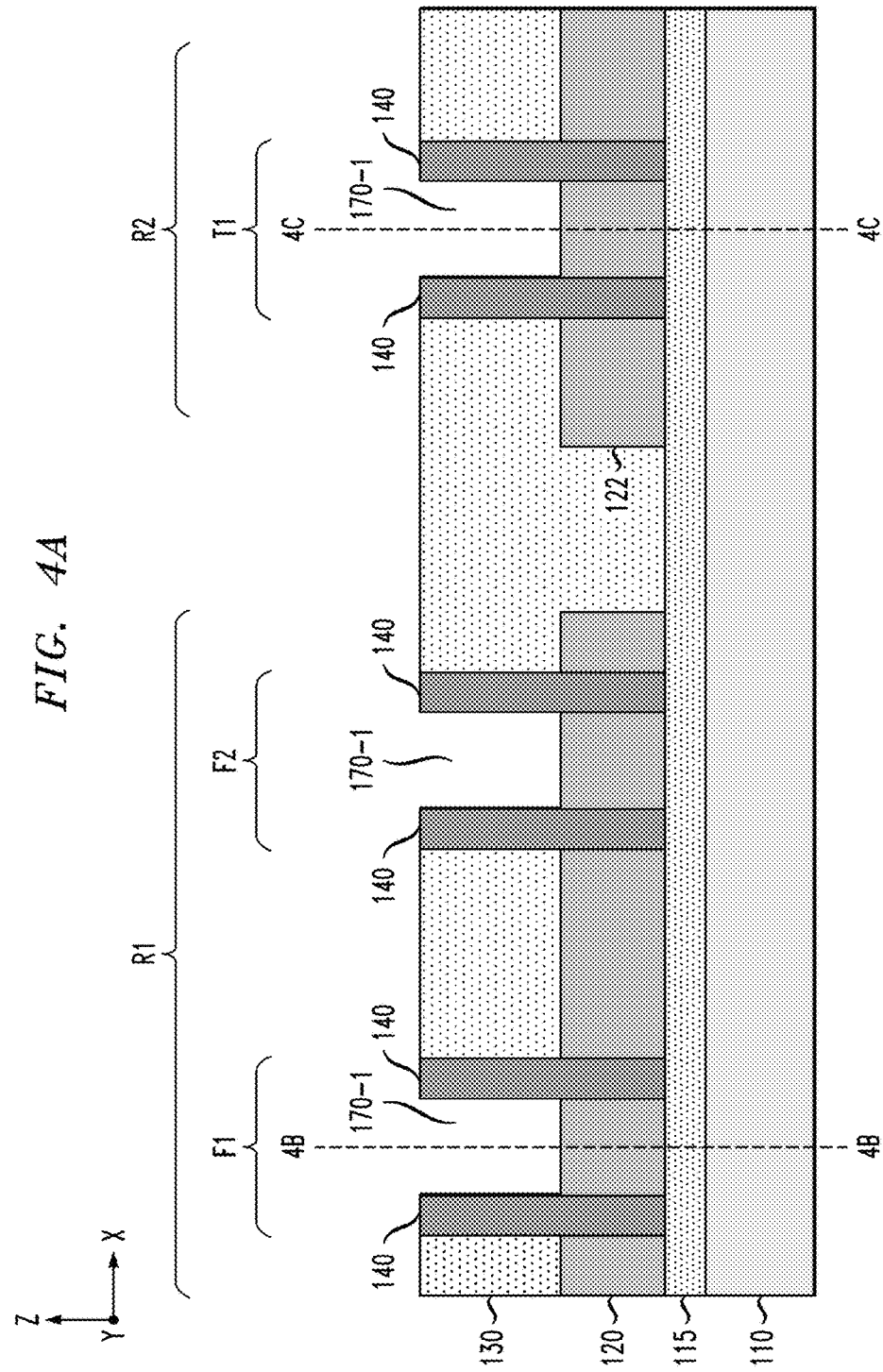
FIGS. 4A/4B/4C are cross-sectional views of the semiconductor structure of FIGS. 3A/3B/3C after removing the dummy gate structures of the vertical fuse devices and FINFET devices to form recessed regions between insulating sidewall spacers.

A next process module in the fabrication process comprises a RMG process flow to replace the dummy gate structures 170 with metallic fuse elements for the vertical fuse devices in the first device region R1 and metal gate electrodes for the FINFET devices in the second device region R2. An exemplary RMG process module begins with removing the dummy gate structures 170. For example, FIGS. 4A/4B/4C are cross-sectional views of the semiconductor structure of FIGS. 3A/3B/3C after removing the dummy gate structures 170 of the vertical fuse devices and FINFET devices to form recessed regions 170-1 between the insulating sidewall spacers 140. FIG. 4B is a schematic cross-sectional view of the semiconductor structure of FIG. 4A taken along line 4B-4B in FIG. 4A, and FIG. 4C is a schematic cross-sectional view of the semiconductor structure of FIG. 4A taken along line 4C-4C in FIG. 4A.

The dummy gate structures 170 can be removed using known methods to form the recesses 170-1 shown in FIGS. 4A/4B/4C. For example, the dummy poly gate layer 174 can be removed using a selective dry etching or wet etching process with suitable etch chemistries, including ammonium hydroxide ($NH_4OH$) or tetramethylammonium hydroxide (TMAH). The etching of the dummy poly gate layer 174 is selective to the insulating/dielectric materials of the PMD layer 130, the insulating sidewall spacers 140, and the dummy gate oxide layer 172. During the poly gate etch process, the dummy gate oxide layer 172 protects the vertical semiconductor fins 120 and 122 from being etched, as the poly etch process is highly selective to the oxide material of the dummy gate oxide layer 172. After the polysilicon material is removed, an oxide etch process is performed to etch away the dummy gate oxide layers 172 selective to the material of the vertical semiconductor fins 120 and 122. In this manner, the dummy gate structures 170 can be etched away without damaging the vertical semiconductor fins 120 and 122.

Next, FIGS. 5A/5B/5C are cross-sectional views of the semiconductor structure of FIGS. 4A/4B/4C after depositing a conformal layer of gate dielectric material 152A and depositing a conformal protective capping layer 180 over the conformal layer of gate dielectric material 152A. FIG. 5B is a schematic cross-sectional view of the semiconductor structure of FIG. 5A taken along line 5B-5B in FIG. 5A, and FIG. 5C is a schematic cross-sectional view of the semiconductor structure of FIG. 5A taken along line 5C-5C in FIG. 5A. As shown in FIGS. 5A/5B/5C, the conformal layer of gate dielectric material 152A is deposited to line the exposed surfaces in the recessed 170-1 in both device regions R1 and R2. The conformal layer of gate dielectric material 152A is subsequently removed from the vertical fuse device region R1, while utilized in the FINFET device region R2 to form the gate dielectric layer 152 of the metal gate electrode 150 of the FINFET device T1.

In one embodiment, the conformal layer of gate dielectric material 152A is formed by depositing one or more conformal layers of gate dielectric material over the surface of the semiconductor structure. The type of dielectric material(s) used to form the conformal layer of gate dielectric material 152A will vary depending on the application. For example, the conformal layer of gate dielectric material 152A may comprise, e.g., nitride, oxynitride, or oxide or a high-k dielectric material having a dielectric constant of about 3.9 or greater. For example, the conformal gate dielectric material 152A can include a high-k dielectric material, including, but not limited to, $SiO_2$ (k~3.9), $HfO_2$ (k=25), $HfSiO_4$ (k=11), $ZrO_2$ (k=25), $Al_2O_3$ (k=9), $TiO_2$ (k=80), $Ta_2O_5$ (k=22), $La_2O_3$ (k=30), $SrTiO_3$ (k=2000), $LaAlO_3$ (k=30) and combinations thereof. In one embodiment of the invention, the conformal layer of gate dielectric material 152A is formed with a thickness in a range of about 0.5 nm to about 2.5 nm, which will vary depending on the target application. The conformal layer of gate dielectric material 152A is deposited using known methods such as ALD, or CVD, for example.

The conformal protective capping layer 180 is a temporary layer that is formed over the conformal layer of gate dielectric material 152A to protect the conformal layer of gate dielectric material 152A from subsequent etching steps which, as explained in further detail below, are utilized to remove the portion of the conformal layer of gate dielectric material 152A from the vertical fuse device region R1. In one embodiment of the invention, the conformal protective capping layer 180 is formed of a material, or combination of materials, which is etch resistance to the etch processes used to remove the portion of the conformal layer of gate dielectric material 152A from the vertical fuse device region R1, while having etch selectivity with regard to the conformal layer of gate dielectric material 152A so that the protective capping layer 180 can be subsequently removed without damaging the underlying conformal layer of gate dielectric material 152A. For example, in one embodiment, the protective capping layer may be formed of TiN.

Next, FIGS. 6A/6B/6C are cross-sectional views of the semiconductor structure of FIGS. 5A/5B/5C after removing portions of the conformal layer of gate dielectric material 152A and the protective capping layer 180 in the vertical fuse device region R1. FIG. 6B is a schematic cross-sectional view of the semiconductor structure of FIG. 6A taken along line 6B-6B in FIG. 6A, and FIG. 6C is a schematic cross-sectional view of the semiconductor structure of FIG. 6A taken along line 6C-6C in FIG. 6A. In one embodiment, the portions of the conformal layer of gate dielectric material 152A and the protective capping layer 180 in the vertical fuse device region R1 can be removed using standard photolithographic techniques.

For example, a layer of photoresist material can be deposited on top of semiconductor structure shown in FIGS. 5A/5B/5C and then lithographically patterned (exposed and developed) to form a photoresist mask having an opening that exposes the stack of layers 152A/180 in the vertical fuse device region R1. One or more sequential etch processes are then performed to etch away the exposed portions of the protective capping layer 180 and the conformal layer of gate dielectric material 152A in the vertical fuse device region R1. The etching can be performed using a dry etch process such as RIE (reactive ion etching) or other etch processes with etching chemistries that are suitable to etch the material (e.g., TiN) of the protective capping layer 180 and the underlying layer of gate dielectric material 152A (e.g., $HfO_2$).

Following the etch process, the photoresist mask is stripped using known etch techniques and etch chemistries (e.g., plasma ashing), resulting in the semiconductor structure shown in FIGS. 6A/6B/6C. After stripping away the photoresist mask, another etch process is then performed to etch away the remaining portion of the protective capping layer 180 in the device region R2. The protective capping layer 180 is etched selective to the materials of the gate dielectric layer 152A, the PMD layer 130, the insulating sidewall spacers 140, and the portions of the vertical semiconductor fin 120 exposed in the recesses 170-1 in the vertical fuse device region R1, etc.

Figure 7A:
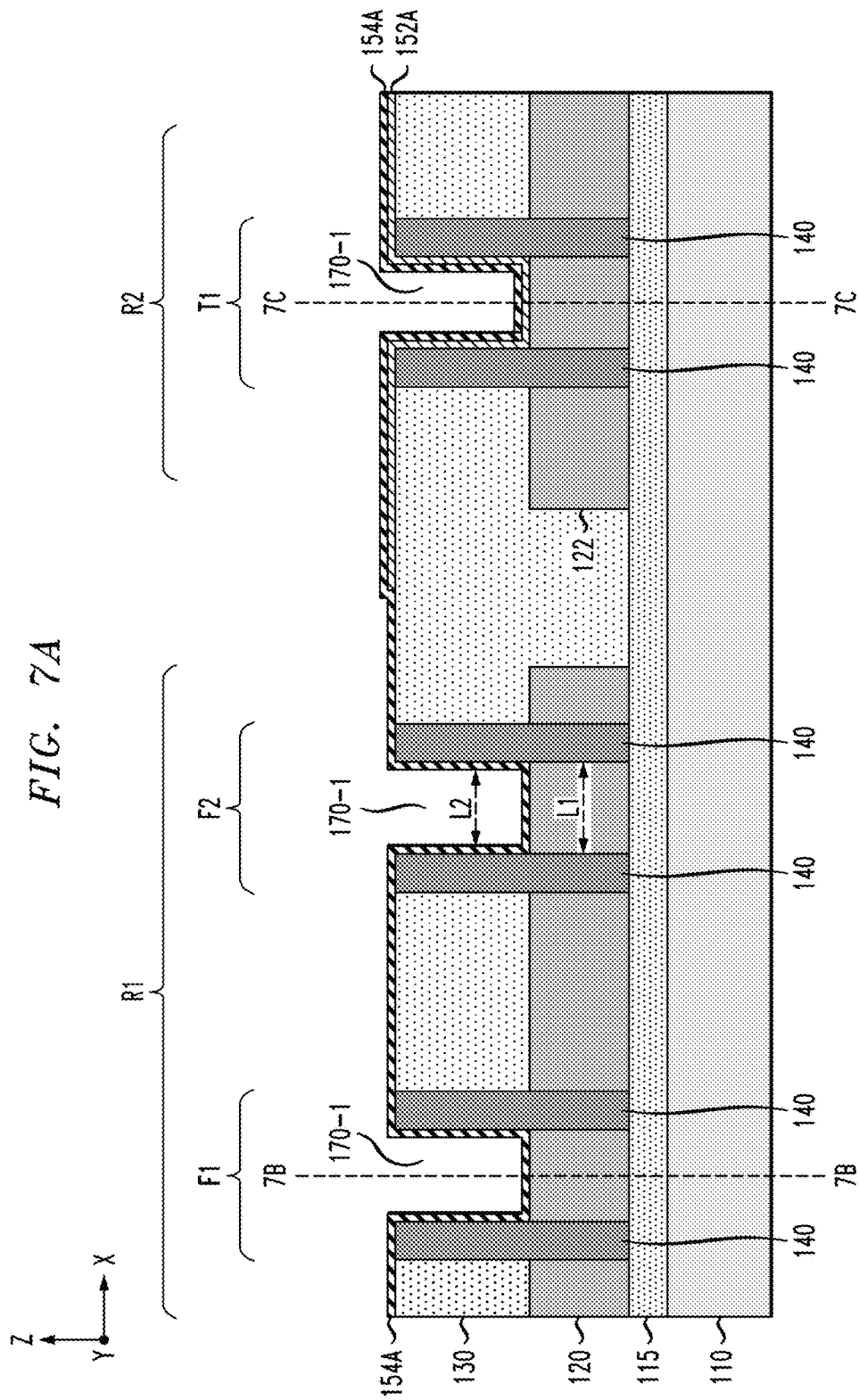
FIGS. 7A/7B/7C are cross-sectional views of the semiconductor structure of FIGS. 6A/6B/6C after removing the protective capping layer in the second device region and depositing a conformal layer of work function metal over the first and second device regions.

FIGS. 7A/7B/7C are cross-sectional views of the semiconductor structure shown in FIGS. 6A/6B/6C after removing the protective capping layer 180 in the FINFET device region R2 and depositing a conformal layer of work function metal 154A over the surface of the semiconductor structure in the device regions R1 and R2. FIG. 7B is a schematic cross-sectional view of the semiconductor structure of FIG. 7A taken along line 7B-7B in FIG. 7A, and FIG. 7C is a schematic cross-sectional view of the semiconductor structure of FIG. 7A taken along line 7C-7C in FIG. 7A. As shown in FIGS. 7A/7B/7C, the conformal layer of work function metal 154A is deposited to line the exposed surfaces in the recesses 170-1 in both device regions R1 and R2.

As depicted in FIGS. 7A and 7C, the portion of the vertical semiconductor fin 122 exposed in the recess 170-1 in the device region R2 is covered with the conformal gate dielectric and work function metal layers 152A and 154A, which forms the high-k metal gate stack structure 152/154 of the metal gate electrode 150 of the FINFET device T1, as shown in FIG. 1A. In addition, as shown in FIGS. 7A and 7B, the portions of the vertical semiconductor fin 120 that are exposed in the recesses 170-1 in the device region R1 are covered with the conformal layer of work function metal 154A. The conformal layer of work function metal 154A in the recesses 170-1 of the device region R1 serves multiple purposes.

For example, as discussed above with reference to FIG. 2, the conformal layer of work function metal 154A comprises a thin interface layer which provides a mechanism to program a given vertical fuse device by melting or vaporizing some or substantially all of the work function metal material (which is disposed on the upper and sidewalls surfaces of the vertical semiconductor fin 120) when a programming voltage VP is applied to the metal fuse element 160 of the given vertical fuse device. The melting/vaporizing is achieved as a result of a high heat density that occurs when high density current flows in the high resistance interface between the work function metal layer and the vertical semiconductor fin 120. Moreover, the conformal layer of work function metal 154A in the device region R1 serves as a wetting layer or seed layer when growing/reflowing/depositing the metallic material that forms the metal electrode layers 156 of the metallic fuse elements 160.

The conformal layer of work function metal 154A may be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work functions metals or alloys that are commonly used to obtain target work functions that a suitable for the type of FINFET devices (e.g., n-type or p-type) that are to be formed in the given device regions. The conformal layer of work function metal 154A is deposited using known methods such as ALD, CVD, etc. In one embodiment, the conformal layer of work function metal 154A is formed with a thickness in a range of about 2 nm to about 5 nm.

To provide context as to dimensions of the vertical fuse devices F1/F2 and FINFET device T1 as shown in FIG. 7A, in one embodiment of the invention, a distance L1 (in the X direction) between the inner surfaces of the insulating sidewall spacers 140 is in a range of about 10 nm to about 20 nm, while the distance L2 within the recesses 170-1 (in device region R1) between the insulating sidewall spacers 140 with the conformal layer of work function metal 154A disposed on the sidewall surfaces of the spacers 140 is less than about 10 nm. The distance L1 represents a gate length of the FINFET devices (e.g., device T1) in the device region R2.

Figure 8A:
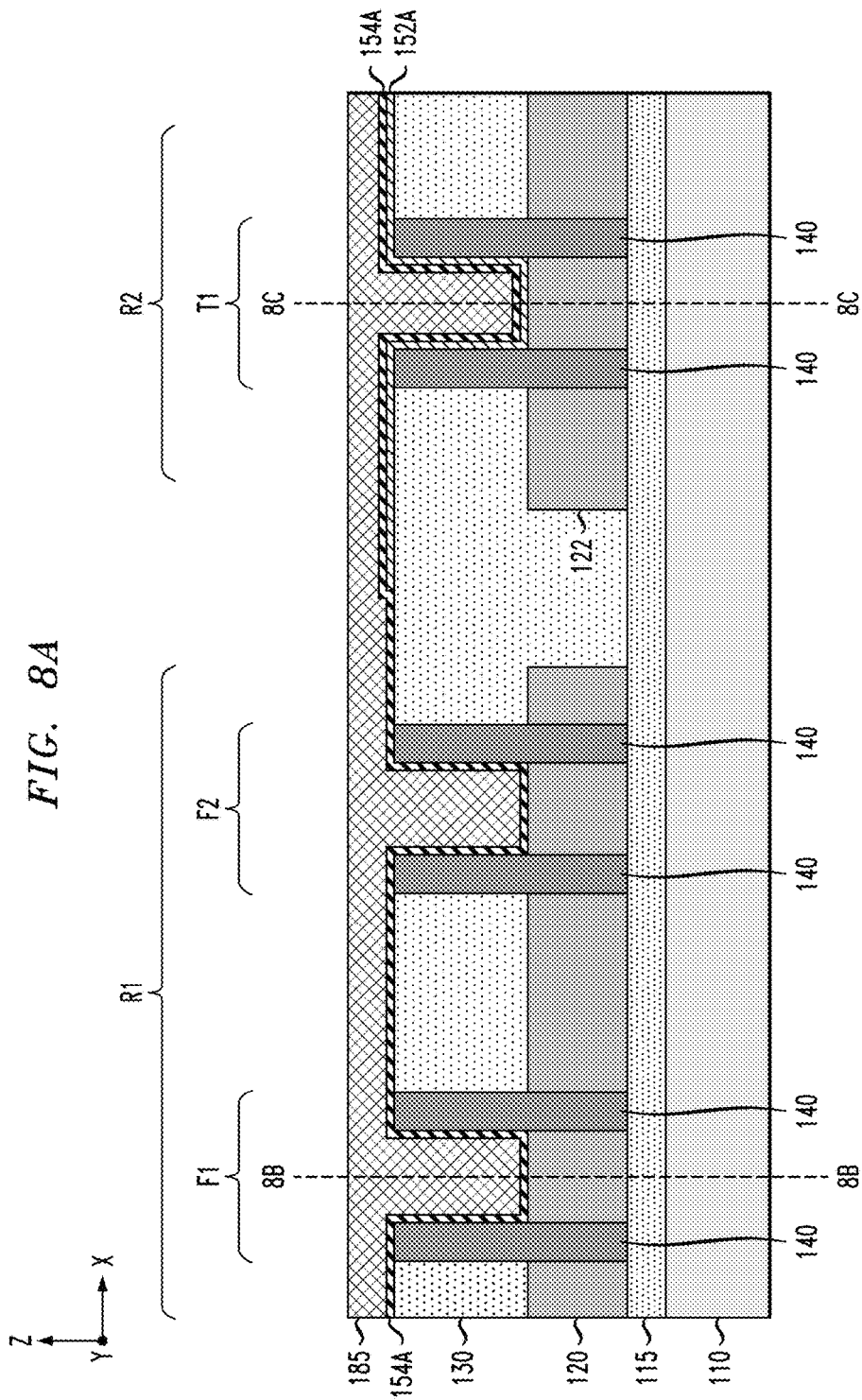
FIGS. 8A/8B/8C are cross-sectional views of the semiconductor structure of FIGS. 7A/7B/7C after depositing an organic planarizing layer to fill the recessed regions between the insulating sidewall spacers.
Figure 8C:
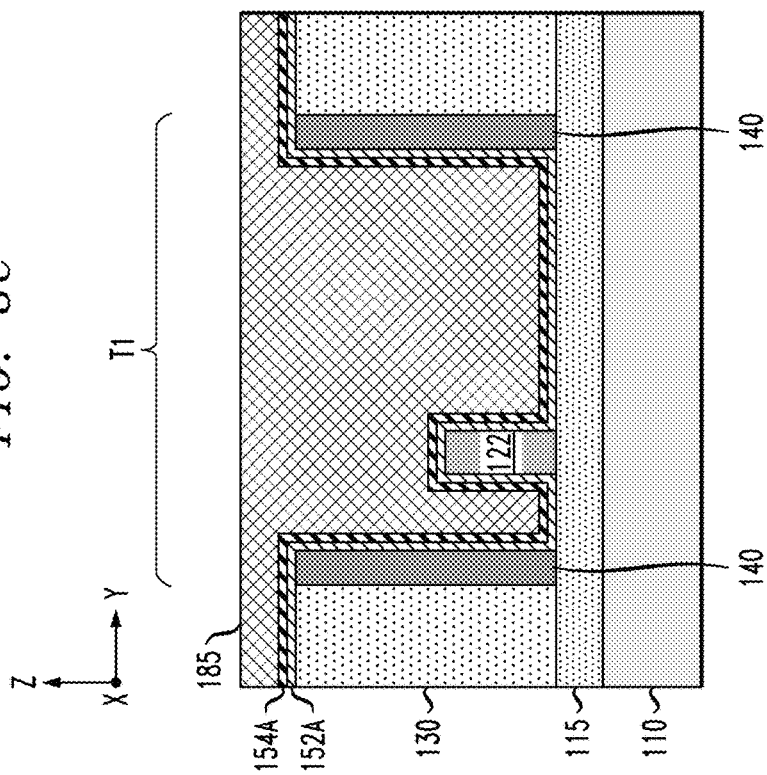
Figure 8B:
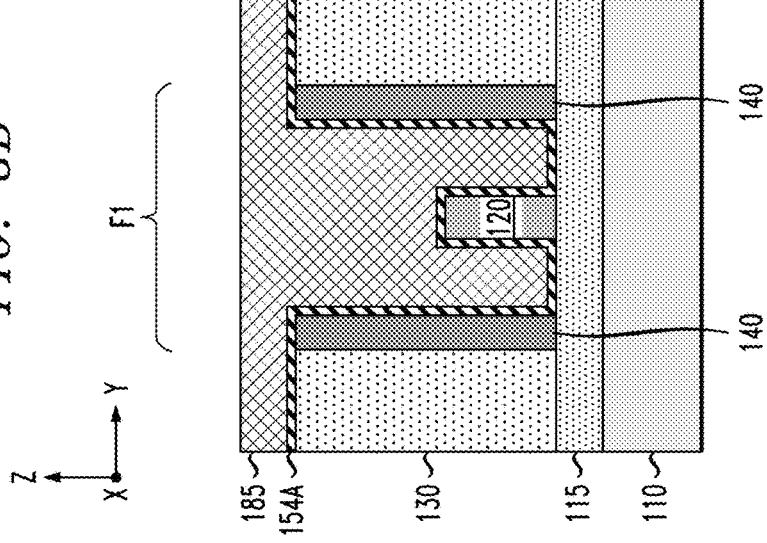

A next process module in the RMG process flow comprises etching away the overburden materials of the conformal gate dielectric and work function metal layers 152A and 154A, and recessing the conformal gate dielectric and work function metal layers 152A and 154A to a target depth within the recesses 170-1. As an initial step, FIGS. 8A/8B/8C are cross-sectional views of the semiconductor structure of FIGS. 7A/7B/7C after depositing an organic planarization layer 185 to fill the recesses 170-1 between the insulating sidewall spacers 140 with organic planarizing material. FIG. 8B is a schematic cross-sectional view of the semiconductor structure of FIG. 8A taken along line 8B-8B in FIG. 8A, and FIG. 8C is a schematic cross-sectional view of the semiconductor structure of FIG. 8A taken along line 8C-8C in FIG. 8A. The organic planarization layer 185 utilized for etch-back processing of the conformal gate dielectric and work function metal layers 152A and 154A. The organic planarization layer 185 can be formed using known organic materials and deposition techniques (e.g., spin on deposition).

Figure 9A:
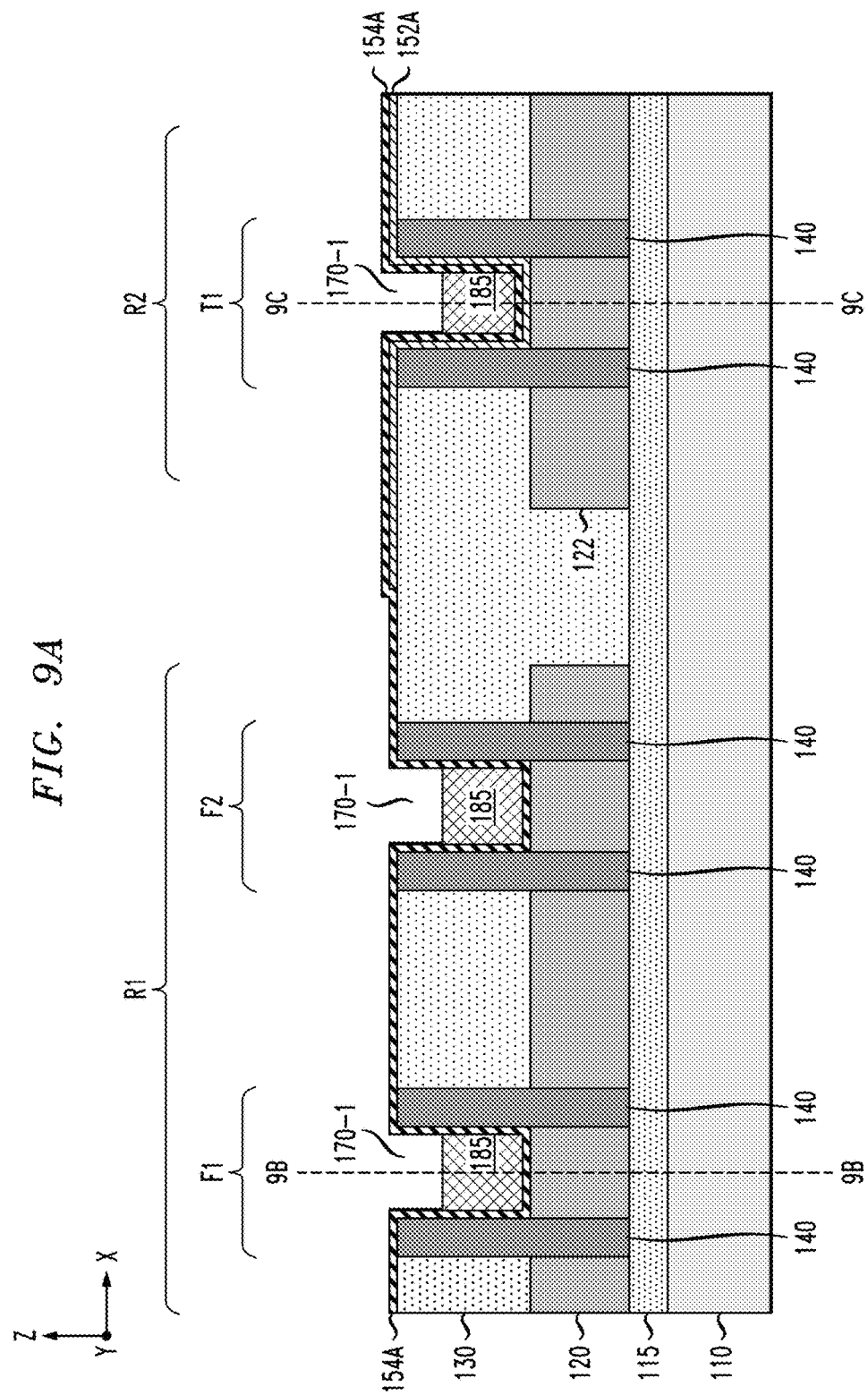
FIGS. 9A/9B/9C are cross-sectional views of the semiconductor structure of FIGS. 8A/8B/8C after etching the organic planarizing layer to a target level within the recessed regions between the insulating sidewall spacers.
Figure 9C:
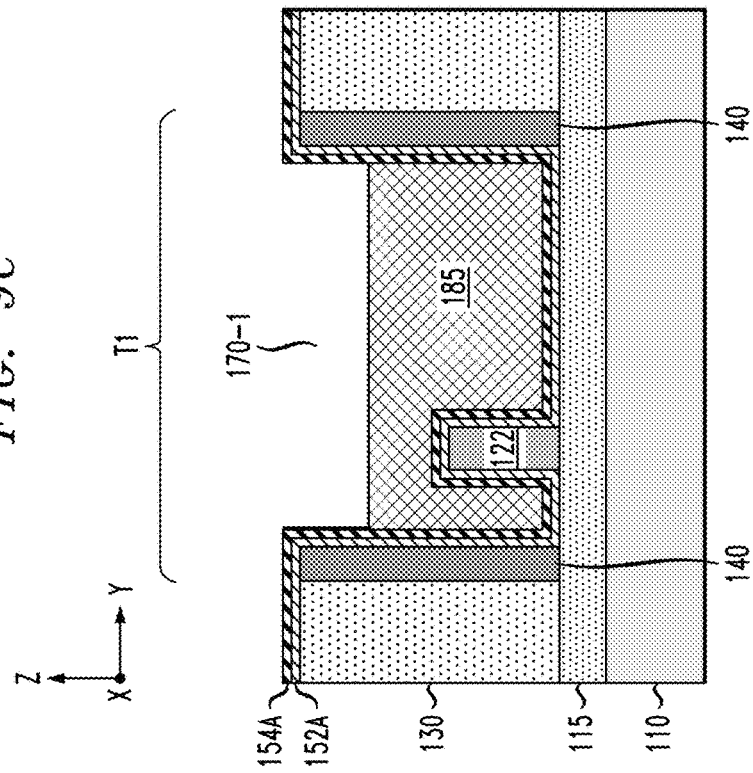
Figure 9B:
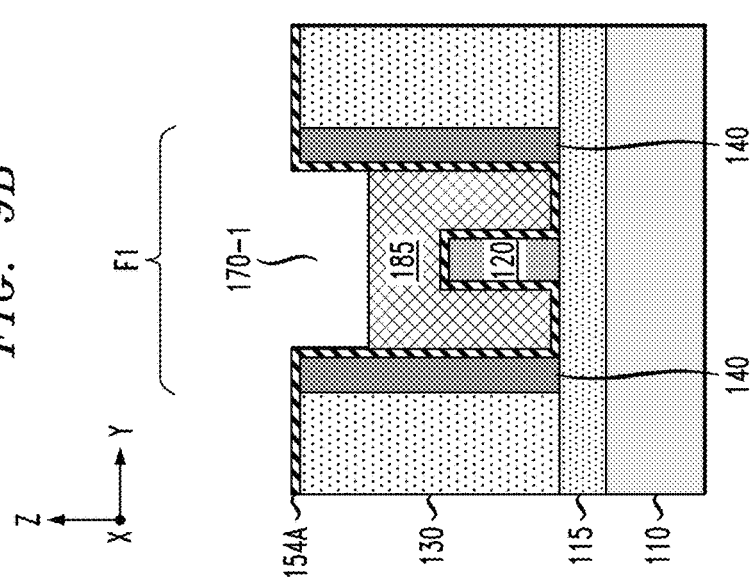

Next, FIGS. 9A/9B/9C are cross-sectional views of the semiconductor structure of FIGS. 8A/8B/8C after etching the organic planarizing layer 185 down to a target level within the recesses 170-1 between the insulating sidewall spacers 140. FIG. 9B is a schematic cross-sectional view of the semiconductor structure of FIG. 9A taken along line 9B-9B in FIG. 9A, and FIG. 9C is a schematic cross-sectional view of the semiconductor structure of FIG. 9A taken along line 9C-9C in FIG. 9A. The organic planarization layer 185 can be etched using a dry etch process with an etch chemistry that is suitable to each the organic material of the organic planarization layer 185. As shown in FIGS. 9A/9B/9C, the recessing of the organic planarization layer 185 is performed to expose portions of the conformal gate dielectric and work function metal layers 152A and 154A on the upper surface of the insulating layer 130, and on the upper inner sidewall surfaces of the insulating sidewall spacers 140 within the recesses 170-1. The exposed portions of the conformal gate dielectric and work function metal layers 152A and 154A as shown in FIGS. 9A/9B/9C are then etched away to form the semiconductor structure shown in FIGS. 10A/10B/10C.

Figure 10A:
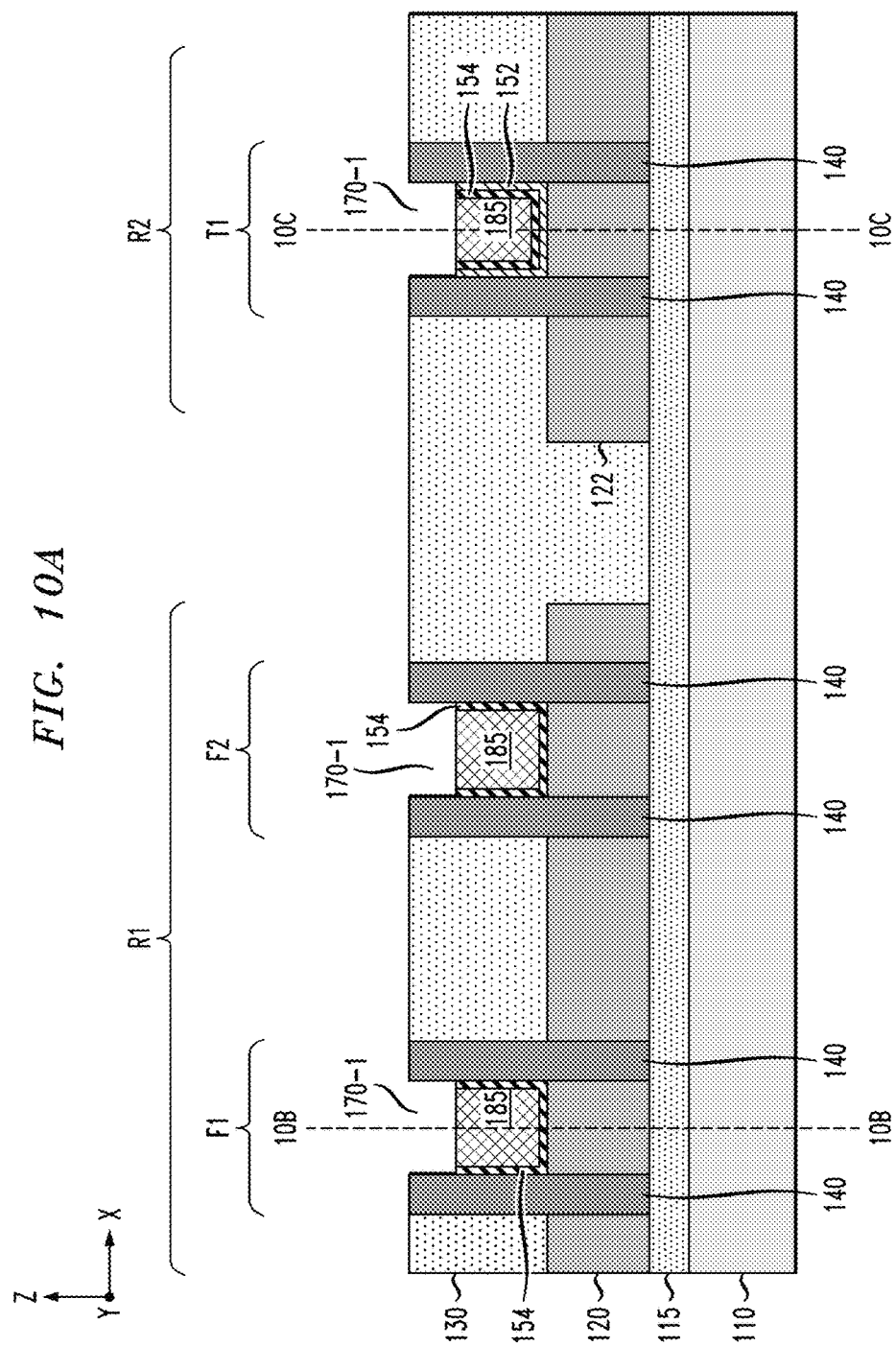
FIGS. 10A/10B/10C are cross-sectional views of the semiconductor structure of FIGS. 9A/9B/9C after etching away exposed portions of the conformal layer of work function metal in the first and second device regions and etching away exposed portions of the conformal layer of gate dielectric material in the second device region.

In particular, FIGS. 10A/10B/10C are cross-sectional views of the semiconductor structure of FIGS. 9A/9B/9C after etching away the exposed portions of conformal gate dielectric and work function metal layers 152A and 154A in the device regions R1 and R2. FIG. 10B is a schematic cross-sectional view of the semiconductor structure of FIG. 10A taken along line 10B-10B in FIG. 10A, and FIG. 10C is a schematic cross-sectional view of the semiconductor structure of FIG. 10A taken along line 10C-10C in FIG. 10A. As shown in FIGS. 10A and 10B, the portions of the conformal work function metal layer 154A which are covered by the remaining organic material of the organic planarization layer 185 within the recesses 170-1 in the device region R1 form the individual work function metal layers 154 of the metallic fuse elements 160 of the vertical fuse devices F1 and F2 in the device region R1.

In addition, as shown in FIGS. 10A and 10C, the portions of the conformal gate dielectric and work function metal layers 152A and 154A which are covered by the remaining organic material of the organic planarization layer 185 within the recess 170-1 in the device region R2 form the high-k metal gate stack structure 152/154 of the metal gate electrode 150 of the FINFET device T1 in the device region R2. The exposed portions of the conformal gate dielectric and work function metal layers 152A and 154A in the device regions R1 and R2 can be etched selective to the materials of PMD layer 130 and the insulating sidewall spacers 140 using known etching techniques and suitable etch chemistries.

Figure 11A:
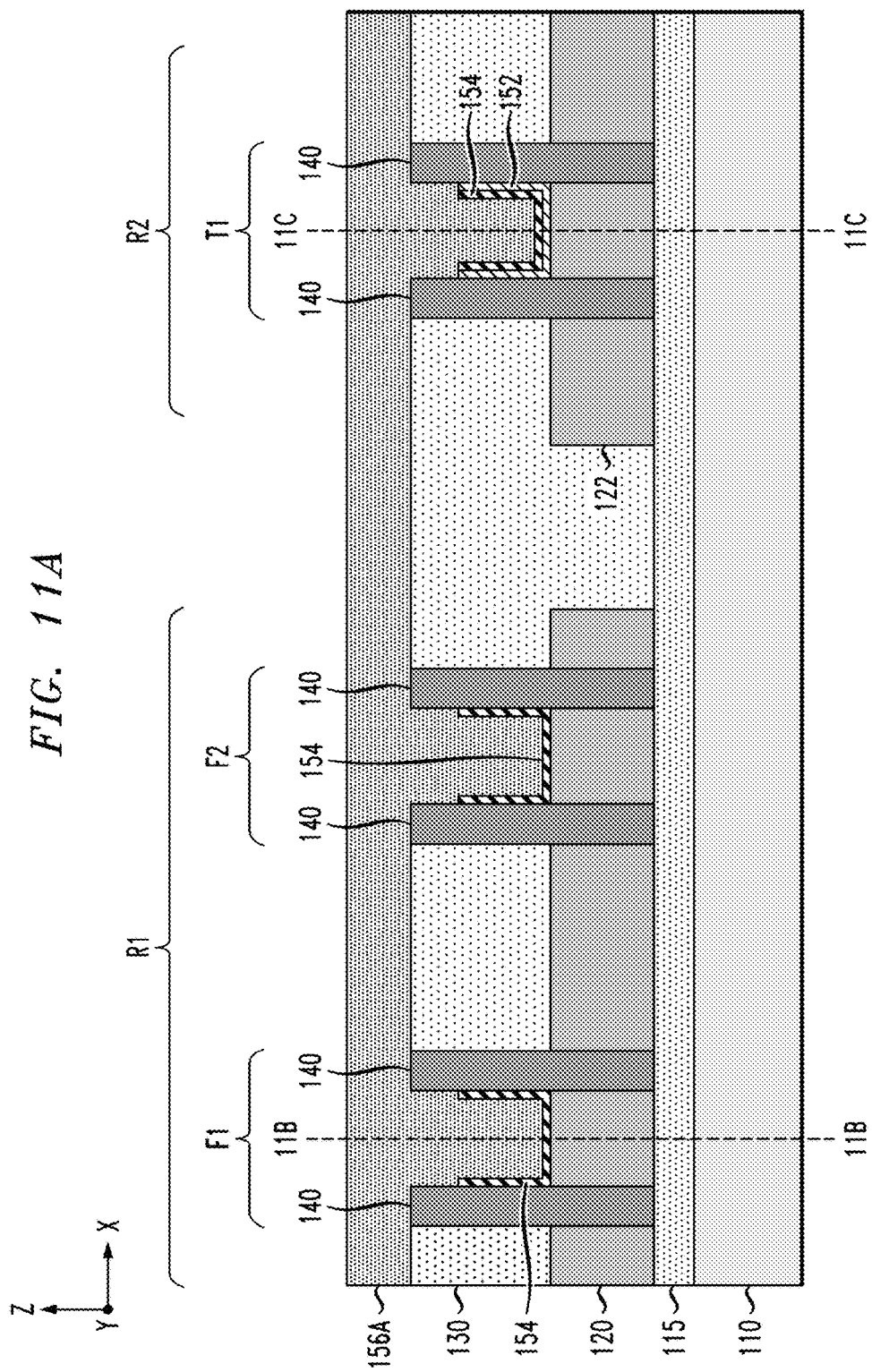
FIGS. 11A/11B/11C are cross-sectional views of the semiconductor structure of FIGS. 10A/10B/10C after stripping away remaining portions of the organic planarizing layer and depositing a layer of metallic material to fill the recessed regions between the insulating sidewall spacers with the metallic material.

A next step in the exemplary process flow is to form the metal electrode layers 156 within the recesses 170-1 in the device regions R1 and R2 to complete the formation of the metallic fuse elements 160 of the vertical fuse devices F1 and F2 in the device region R1, and to complete formation of the metal gate electrode 150 of the FINFET device T1 in the device region R2. For example, FIGS. 11A/11B/11C are cross-sectional views of the semiconductor structure of FIGS. 10A/10B/10C after stripping away remaining portions of the organic planarizing layer 185 and depositing a layer of metallic material 156A to fill the recesses 170-1 between the insulating sidewall spacers 140 with metallic material. FIG. 11B is a schematic cross-sectional view of the semiconductor structure of FIG. 11A taken along line 11B-11B in FIG. 11A, and FIG. 11C is a schematic cross-sectional view of the semiconductor structure of FIG. 11A taken along line 11C-11C in FIG. 11A. As shown in FIGS. 11A and 11B, the recesses 170-1 in the device region R1 are completely filled the metallic material 156A, and as shown in FIGS. 11A and 11C, the recess 170-1 in the device region R2 is completely filled with the metallic material 156A.

In one embodiment of the invention, the layer of metallic material 156A comprises a low-resistance conductive material including, but not limited to, W, Al, Ni, Co, or any metallic or conductive material that is commonly used to form gate electrode structures. In other embodiments, the layer of metallic material 156A may comprises a metal silicide such as Ni silicide or Co silicide. The layer of metallic material 156A can be formed by depositing a metallic material such as aluminum, and then performing a metal reflow process to allow the layer of metallic material to reflow into and fill the recess 170-1. In another embodiment, the layer a metallic material 156A may be a metallic material such as tungsten which is deposited using CVD, for example.

Figure 12A:
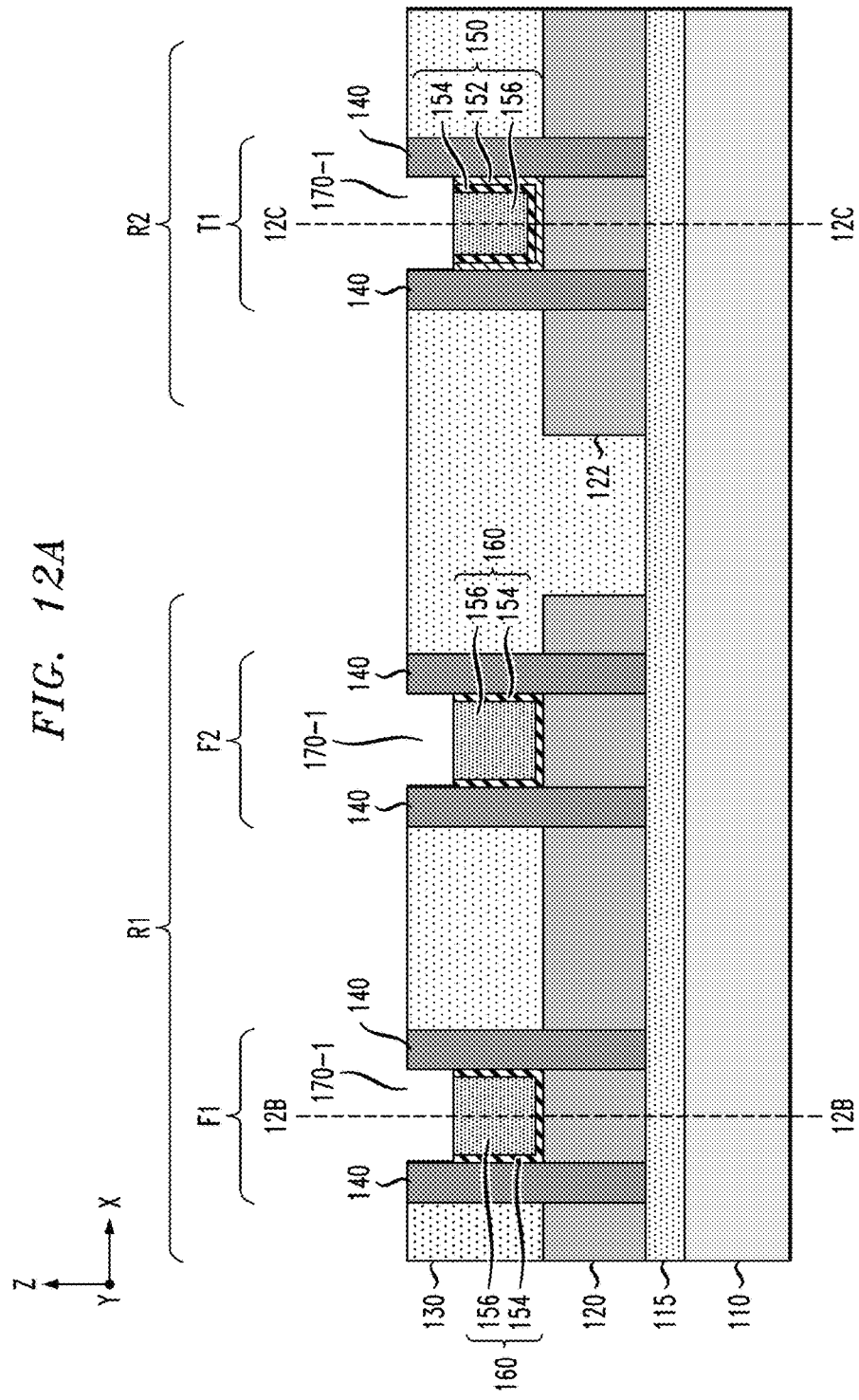
FIGS. 12A/12B/12C are cross-sectional views of the semiconductor structure of FIGS. 11A/11B/11C after etching the layer of metallic material down to the target level within the recessed regions between the insulating sidewall spacers to form a metal gate electrode.

Following deposition of the layer of metallic material 156A, a planarization process (e.g., CMP) may be performed to remove the overburden metallic material on the upper surface of the semiconductor structure by planarizing the surface down to the PMD layer 130. Following the planarization process, an etch back process is performed to recess the layer of metallic material 156A within the recesses 170-1 in the device regions R1 and R2. For example, FIGS. 12A/12B/12C are cross-sectional views of the semiconductor structure of FIGS. 11A/11B/11C after etching the layer of metallic material 156A down to a target level within the recesses 170-1 between the insulating sidewall spacers 140 to form the separate metal electrode layers 156 of the metallic fuse elements 160 of the vertical fuse devices F1 and F2 in the device region R1, and to form the metal gate electrode 150 of the FINFET device T1 in the device region R2. FIG. 12B is a schematic cross-sectional view of the semiconductor structure of FIG. 12A taken along line 12B-12B in FIG. 12A, and FIG. 12C is a schematic cross-sectional view of the semiconductor structure of FIG. 12A taken along line 12C-12C in FIG. 12A.

As shown in FIGS. 12A and 12B, the layer of metallic material 156A is etched down within the recesses 170-1 of the vertical fuse device region R1 to a level of the upper portion of the conformal work function metal layer 154 on the sidewall surfaces of the insulating sidewall spacers 140. As shown in FIGS. 12A and 12C, the layer of metallic material 156A is etched down within the recesses 170-1 of the FINFET device region R2 to a level of the upper portion of the conformal gate dielectric and work function metal layers 152 and 154 on the sidewall surfaces of the insulating sidewall spacers 140. The layer of metallic material 156A can be recessed using suitable etch process with etch chemistries that are suitable to etch the metallic material 156A.

A next step in the fabrication process comprises forming the capping layers 145 within the recesses 170-1 to cover the metallic fuse elements 160 of the vertical fuse devices F1/F2 in the device region R1, and to cover the metal gate electrode 150 of the FINFET device T1 in the device regions R2. For example, FIGS. 13A/13B/13C are cross-sectional views of the semiconductor structure of FIGS. 12A/12B/12C after forming the dielectric capping layers 145 to cover the metallic fuse elements 160 of the vertical fuse devices F1/F2, and to cover the metal gate electrode 150 of the FINFET device T1. FIG. 13B is a schematic cross-sectional view of the semiconductor structure of FIG. 13A taken along line 13B-13B in FIG. 13A, and FIG. 13C is a schematic cross-sectional view of the semiconductor structure of FIG. 13A taken along line 13C-13C in FIG. 13A.

Figure 13A:
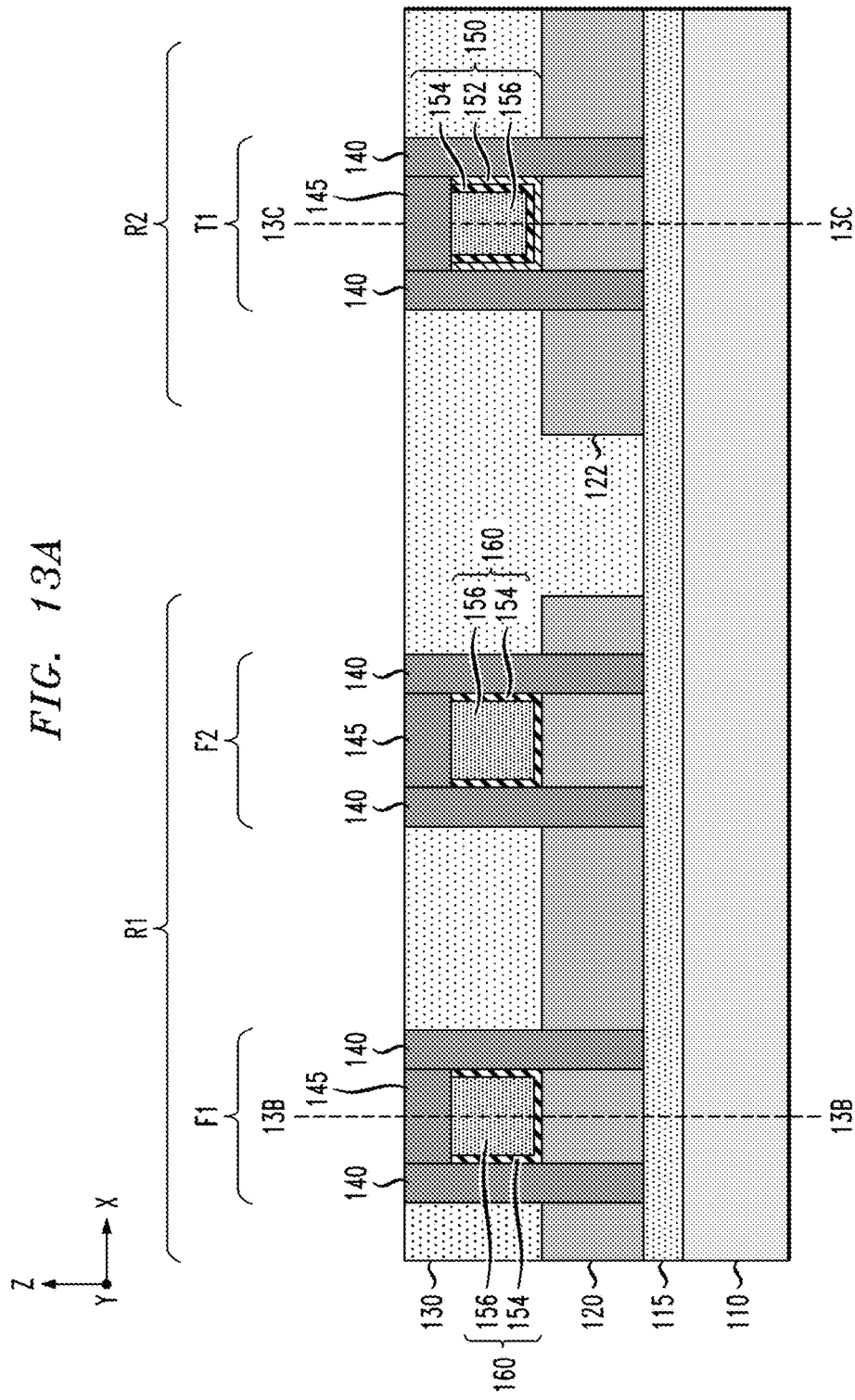
FIGS. 13A/13B/13C are cross-sectional views of the semiconductor structure of FIGS. 12A/12B/12C after forming dielectric capping layers to cover the metal gate electrodes.

The dielectric capping layers 145 can be formed by depositing a layer of dielectric material, such as SiN, to fill the upper portions of the recesses 170-1 with dielectric material, followed by a CMP process to remove the overburden dielectric material and planarize the surface of the semiconductor structure down to the upper surface of the PMD layer 130, resulting in the semiconductor structure shown in FIGS. 13A/13B/13C. Following formation of the dielectric capping layers 145, the process flow continues with forming the vertical contacts 200, 202, 210 and 212, as shown in FIGS. 1A/1B/1C, using known methods as discussed above.

It is to be understood that the methods discussed herein for fabricating vertical fuse devices and FINFET device can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device, comprising:
    a plurality of vertical semiconductor fins formed on a semiconductor substrate, the plurality of vertical semiconductor fins comprising a first vertical semiconductor fin and a second vertical semiconductor fin;
    a vertical fuse device comprising a metallic fuse element formed over a portion of the first vertical semiconductor fin, wherein the metallic fuse element comprises a first conformal metallic layer formed on the portion of the first vertical semiconductor fin, and a first metallic electrode layer formed on the first conformal metallic layer; and
    a FINFET (Fin Field Effect Transistor) device comprising a metallic gate electrode formed over a portion of the second vertical semiconductor fin, wherein the metallic gate electrode comprises a high-k metallic gate stack structure conformally formed on the portion of the second vertical semiconductor fin and a second metallic electrode layer formed on the high-k metallic gate stack structure, wherein the high-k metallic gate stack structure comprises a conformal layer of dielectric material formed on the portion of the second vertical semiconductor fin and a second conformal metallic layer formed on the conformal layer of dielectric material;
    wherein the first conformal metallic layer and the second conformal metallic layer are patterned from a same conformal layer of metallic material; and
    wherein the first metallic electrode layer and the second metallic electrode layer are patterned from a same layer of metallic material.

2. The device of claim 1, wherein the metallic fuse element of the vertical fuse device and the metallic gate electrode of the FINFET device are concurrently formed as part of a RMG (replacement metal gate) process.

3. The device of claim 1, further comprising:
    a first fuse contact formed in contact with the metallic fuse element of the vertical fuse device; and
    a second fuse contact formed in contact with a portion of the first vertical semiconductor fin adjacent to the vertical fuse device.

4. The device of claim 1, wherein the metallic fuse element is formed between insulating sidewall spacers of the vertical fuse device, and wherein the metallic gate electrode is formed between insulating sidewall spacers of the FINFET device.

5. The device of claim 1, wherein the conformal layer of metallic material that is patterned to form the first conformal metallic layer and the second conformal metallic layer comprises a work function metallic material that is utilized to obtain a target work function for the high-k metallic gate stack structure of the metallic gate electrode of the FINFET device.

6. The device of claim 1, wherein the conformal layer of metallic material that is patterned to form the first conformal metallic layer and the second conformal metallic layer comprises at least one of TaN, TiN, and TiAlC.

7. The device of claim 1, wherein the conformal layer of dielectric material comprises a high-k dielectric material having a dielectric constant k of about 3.0 or greater.

8. The device of claim 1, wherein the layer of metallic material that is patterned to form the first metallic electrode layer and the second metallic electrode layer comprises at least one of Al, W, Co and a metal silicide.

9. The device of claim 1, further comprising a first capping layer formed on the metallic fuse element of the vertical fuse device and a second capping layer formed on the metallic gate electrode of the FINFET device.

10. The device of claim 9, further comprising:
a first vertical contact formed through the first capping layer in contact with the metallic fuse element of the vertical fuse device; and
a second vertical contact formed through the second capping layer in contact with the metallic gate electrode of the FINFET device.

11. A semiconductor device, comprising:
a plurality of vertical semiconductor fins formed on a semiconductor substrate, the plurality of vertical semiconductor fins comprising a first vertical semiconductor fin and a second vertical semiconductor fin;
a vertical fuse device comprising:
a metallic fuse element formed over a portion of the first vertical semiconductor fin, wherein the metallic fuse element comprises a first conformal metallic layer formed on the portion of the first vertical semiconductor fin, and a first metallic electrode layer formed on the first conformal metallic layer;
a first insulating sidewall spacer surrounding the metallic fuse element; and
a first capping layer formed on an upper surface of the metallic fuse element; and
a FINFET (Fin Field Effect Transistor) device comprising:
a metallic gate electrode formed over a portion of the second vertical semiconductor fin, wherein the metallic gate electrode comprises a high-k metallic gate stack structure conformally formed on the portion of the second vertical semiconductor fin and a second metallic electrode layer formed on the high-k metallic gate stack structure, wherein the high-k metallic gate stack structure comprises a conformal layer of dielectric material formed on the portion of the second vertical semiconductor fin and a second conformal metallic layer formed on the conformal layer of dielectric material;
a second insulating sidewall spacer surrounding the metallic gate electrode; and
a second capping layer formed on an upper surface of the metallic fuse element;
wherein the first conformal metallic layer and the second conformal metallic layer are patterned from a same conformal layer of metallic material; and
wherein the first metallic electrode layer and the second metallic electrode layer are patterned from a same layer of metallic material.

12. The device of claim 11, wherein the metallic fuse element of the vertical fuse device and the metallic gate electrode of the FINFET device are concurrently formed as part of a RMG (replacement metal gate) process.

13. The device of claim 11, further comprising:
a first fuse contact formed in contact with the metallic fuse element of the vertical fuse device; and
a second fuse contact formed in contact with a portion of the first vertical semiconductor fin adjacent to the vertical fuse device.

14. The device of claim 11, wherein the conformal layer of metallic material that is patterned to form the first conformal metallic layer and the second conformal metallic layer comprises a work function metallic material that is utilized to obtain a target work function for the high-k metallic gate stack structure of the metallic gate electrode of the FINFET device.

15. The device of claim 11, wherein the conformal layer of metallic material that is patterned to form the first conformal metallic layer and the second conformal metallic layer comprises at least one of TaN, TiN, and TiAlC.

16. The device of claim 11, wherein the conformal layer of dielectric material comprises a high-k dielectric material having a dielectric constant k of about 3.0 or greater.

17. The device of claim 11, wherein the layer of metallic material that is patterned to form the first metallic electrode layer and the second metallic electrode layer comprises at least one of Al, W, Co and a metal silicide.

18. The device of claim 11, further comprising:
a first vertical contact formed through the first capping layer in contact with the metallic fuse element of the vertical fuse device; and
a second vertical contact formed through the second capping layer in contact with the metallic gate electrode of the FINFET device.

19. The device of claim 11, further comprising:
a second metallic fuse element formed over a second portion of the first vertical semiconductor fin, wherein second the metallic fuse element comprises:
a third conformal metallic layer formed on the portion of the first vertical semiconductor fin, and a third metallic electrode layer formed on the second conformal metallic layer;
a third insulating sidewall spacer surrounding the second metallic fuse element; and
a third capping layer formed on an upper surface of the second metallic fuse element.

20. The device of claim 19, further comprising a fuse contact formed in contact with a portion of the first vertical semiconductor fin disposed between the first and second metallic fuse elements.

* * * * *